US012751162B2

(12) United States Patent
Shimizu et al.

(10) Patent No.: US 12,751,162 B2
(45) Date of Patent: Sep. 29, 2026

(54) DISPLAY DEVICE

(71) Applicant: Sharp Display Technology Corporation, Kameyama City (JP)

(72) Inventors: Yukio Shimizu, Kameyama City (JP); Shinzoh Murakami, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 347 days.

(21) Appl. No.: 18/289,315

(22) PCT Filed: Jun. 24, 2021

(86) PCT No.: PCT/JP2021/023958
§ 371 (c)(1),
(2) Date: Nov. 2, 2023

(87) PCT Pub. No.: WO2022/269863
PCT Pub. Date: Dec. 29, 2022

(65) Prior Publication Data

US 2024/0357882 A1 Oct. 24, 2024

(51) Int. Cl.

| | |
|---|---|
| ***H10K 59/131*** | (2023.01) |
| ***H10K 59/80*** | (2023.01) |
| ***H10K 77/10*** | (2023.01) |
| ***H10K 102/00*** | (2023.01) |

(52) U.S. Cl.
CPC ....... *H10K 59/131* (2023.02); *H10K 59/8731* (2023.02); *H10K 77/111* (2023.02); *H10K 2102/311* (2023.02)

(58) Field of Classification Search
CPC ............. H10K 59/131; H10K 59/8731; H10K 77/111; H10K 2102/311; G09F 9/00; G09F 9/30
See application file for complete search history.

(56) References Cited

U.S. PATENT DOCUMENTS

| | | | | |
|---|---|---|---|---|
| 2015/0187803 A1* | 7/2015 | Moh | .................. G02F 1/13458 438/23 |
| 2016/0043340 A1* | 2/2016 | Ohara | ................ H10K 59/8731 438/26 |
| 2020/0303468 A1* | 9/2020 | In | ........................... H10K 59/40 |
| 2021/0223834 A1 | 7/2021 | Tsai | |

FOREIGN PATENT DOCUMENTS

| | | | |
|---|---|---|---|
| CN | 109524444 | A | 3/2019 |
| JP | 3914478 | B2 | 5/2007 |
| JP | 2008-275967 | A | 11/2008 |
| JP | 2015-201256 | A | 11/2015 |
| JP | 2016-039078 | A | 3/2016 |

* cited by examiner

*Primary Examiner* — Marc-Anthony Armand
(74) *Attorney, Agent, or Firm* — ScienBiziP, P.C.

(57) ABSTRACT

In a chip mounting portion, a plurality of chip terminals arranged in a row and a plurality of terminal wiring lines corresponding to the plurality of chip terminals, the plurality of terminal wiring lines extending parallel to one another and being electrically connected to the plurality of chip terminals, respectively, are provided. For at least one chip terminal of the plurality of chip terminals, a chip support body is provided at each terminal wiring line with the chip support body overlapping the terminal wiring line corresponding to the at least one chip terminal or an extension line of the terminal wiring line.

20 Claims, 13 Drawing Sheets

DISPLAY DEVICE

TECHNICAL FIELD

The disclosure relates to a display device.

BACKGROUND ART

In recent years, as a display device replacing a liquid crystal display device, a self-luminous organic electroluminescence (hereinafter also referred to as "EL") display device using an organic EL element has attracted attention. In this organic EL display device, a flexible organic EL display device in which an organic EL element or the like is formed on a resin substrate layer having flexibility is proposed.

For example, JP 3914478 B describes a large-scale integration (LSI) chip on flexible circuit board in which a spacing unit for maintaining a minimum interval between an LSI terminal and an LSI chip when the LSI chip is mounted is provided in an opening of an insulating film formed as a region for mounting the LSI chip.

CITATION LIST

Patent Literature

PTL1: JP 3914478 B

SUMMARY OF INVENTION

Technical Problem

In the LSI chip on flexible wiring board described in JP 3914478 B, although deflection of the flexible wiring board can be suppressed by the spacing unit, since the spacing unit is disposed straddling the plurality of terminals arranged side by side, the conductive particles forming the anisotropic conductive film may clump together between the spacing unit and a bump of the LSI chip, with the clump of conductive particles disadvantageously forming a connection. In this case, the adjacent terminals may be short-circuited by the connected conductive particles. This shows that there is still room for improvement.

The disclosure has been made in view of the above, and an object of the disclosure is to suppress short-circuiting between terminals in a chip mounting portion.

Solution to Problem

To achieve the object described above, a display device according to the disclosure-includes: a flexible substrate layer; a thin film transistor layer provided on the flexible substrate layer; and a light-emitting element layer provided on the thin film transistor layer and including a plurality of light-emitting elements, the plurality of light-emitting elements arrayed corresponding to a plurality of subpixels constituting a display region, respectively, wherein a frame region is provided around the display region, a terminal portion extending in one direction is provided at an end portion of the frame region, a chip mounting portion is provided between the display region and the terminal portion, the display device is provided with a plurality of chip terminals arranged in a row in the chip mounting portion and a plurality of terminal wiring lines corresponding to the plurality of chip terminals, the plurality of terminal wiring lines extending parallel to one another and being electrically connected to the plurality of chip terminals, respectively, and in the chip mounting portion, for at least one chip terminal of the plurality of chip terminals, a chip support body is provided at each terminal wiring line with the chip support body overlapping the terminal wiring line corresponding to the at least one chip terminal or an extension line of the terminal wiring line.

Advantageous Effects of Disclosure

According to the disclosure, short-circuiting between terminals in a chip mounting portion can be suppressed.

DESCRIPTION OF EMBODIMENTS

Embodiments of a technique according to the present invention will be described

Embodiments of a technique according to the disclosure will be described below in detail with reference to the drawings. Note that the technique according to the disclosure is not limited to the embodiments to be described below.

FIRST EMBODIMENT

Figure 1:
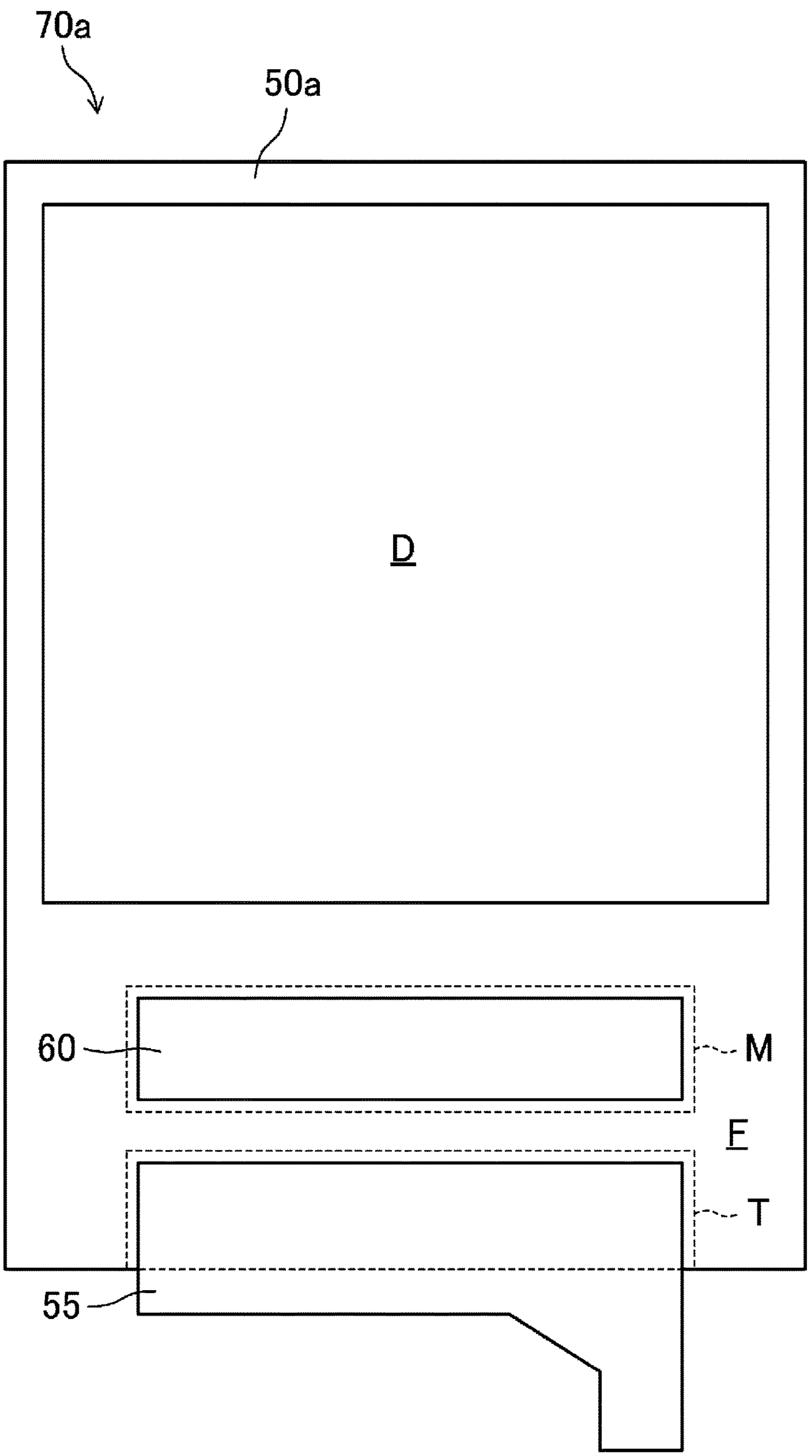
FIG. 1 is a plan view illustrating a schematic configuration of an organic EL display device according to a first embodiment of the disclosure.
Figure 2:
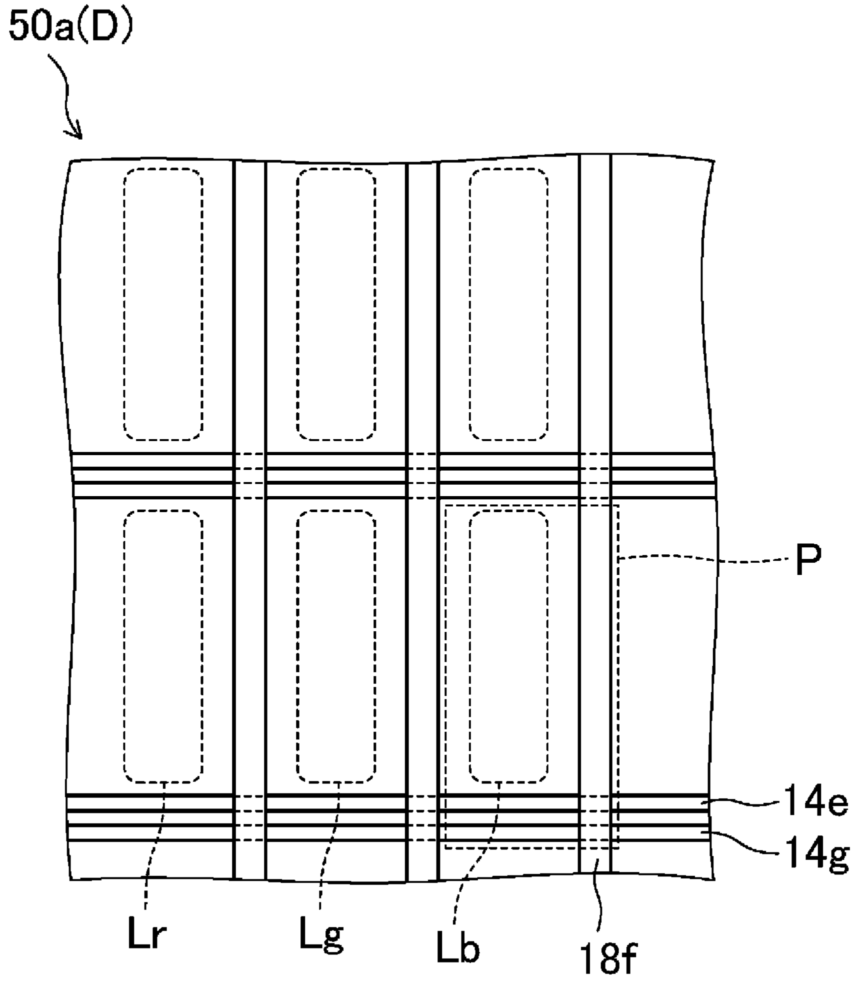
FIG. 2 is a plan view of a display region of an organic EL display panel constituting the organic EL display device according to the first embodiment of the disclosure.
Figure 3:
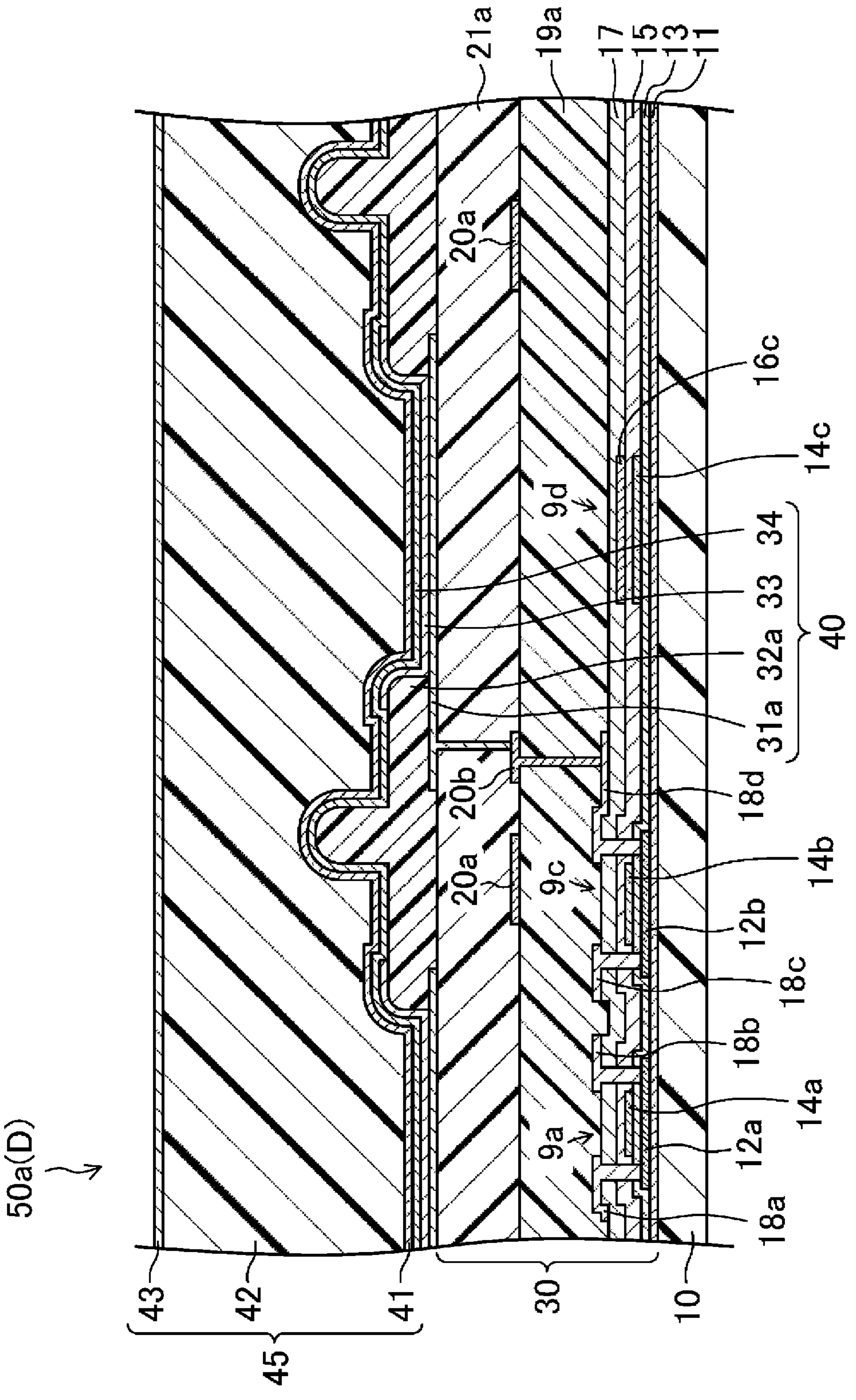
FIG. 3 is a cross-sectional view of the display region of the organic EL display panel constituting the organic EL display device according to the first embodiment of the disclosure.
Figure 4:
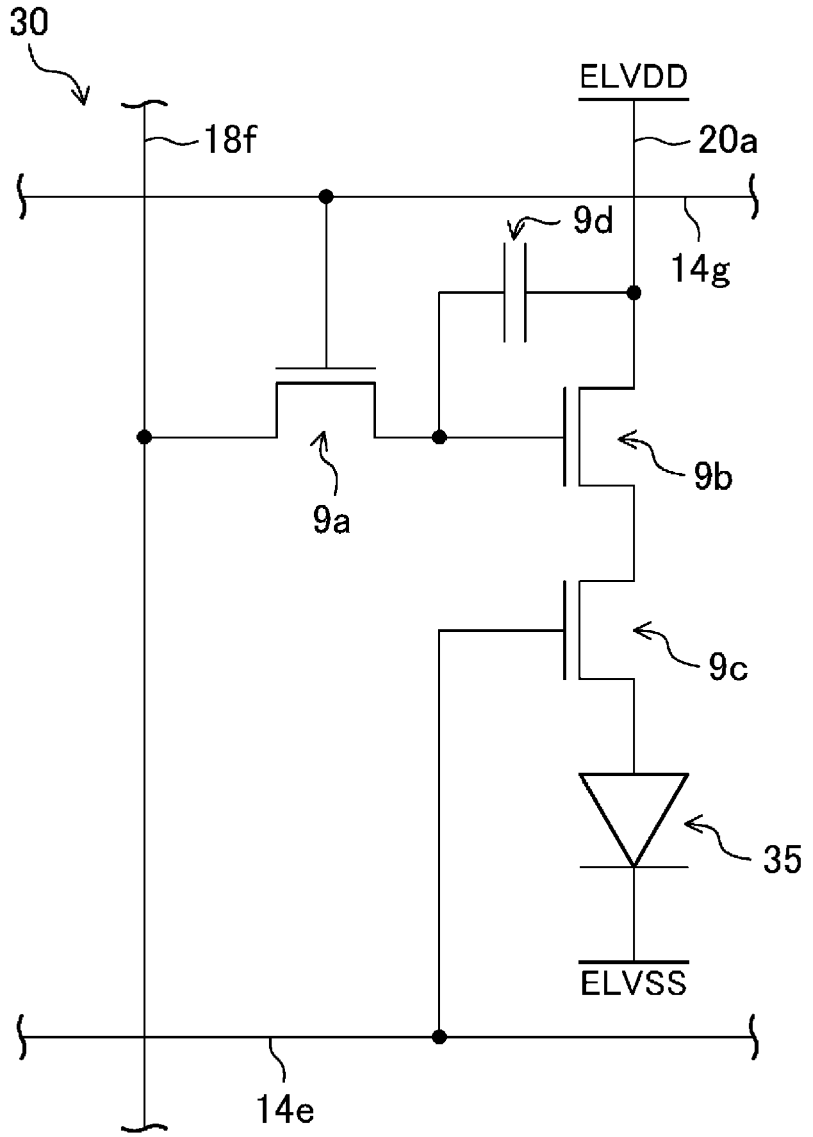
FIG. 4 is an equivalent circuit diagram of a thin film transistor layer constituting the organic EL display panel of the organic EL display device according to the first embodiment of the disclosure.
Figure 5:
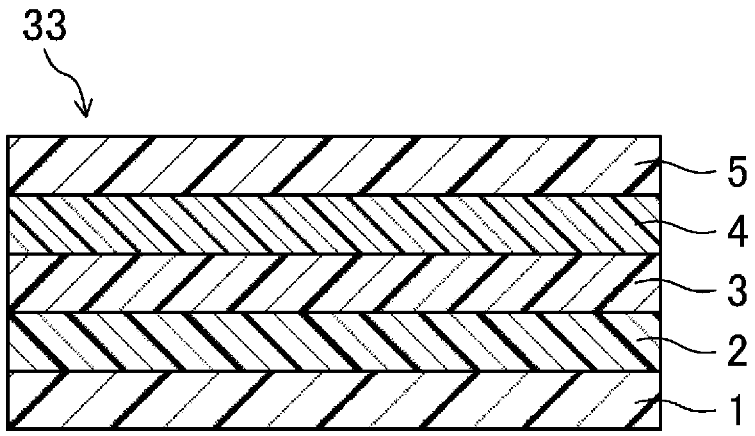
FIG. 5 is a cross-sectional view illustrating an organic EL layer constituting the organic EL display panel of the organic EL display device according to the first embodiment of the disclosure.
Figure 6:
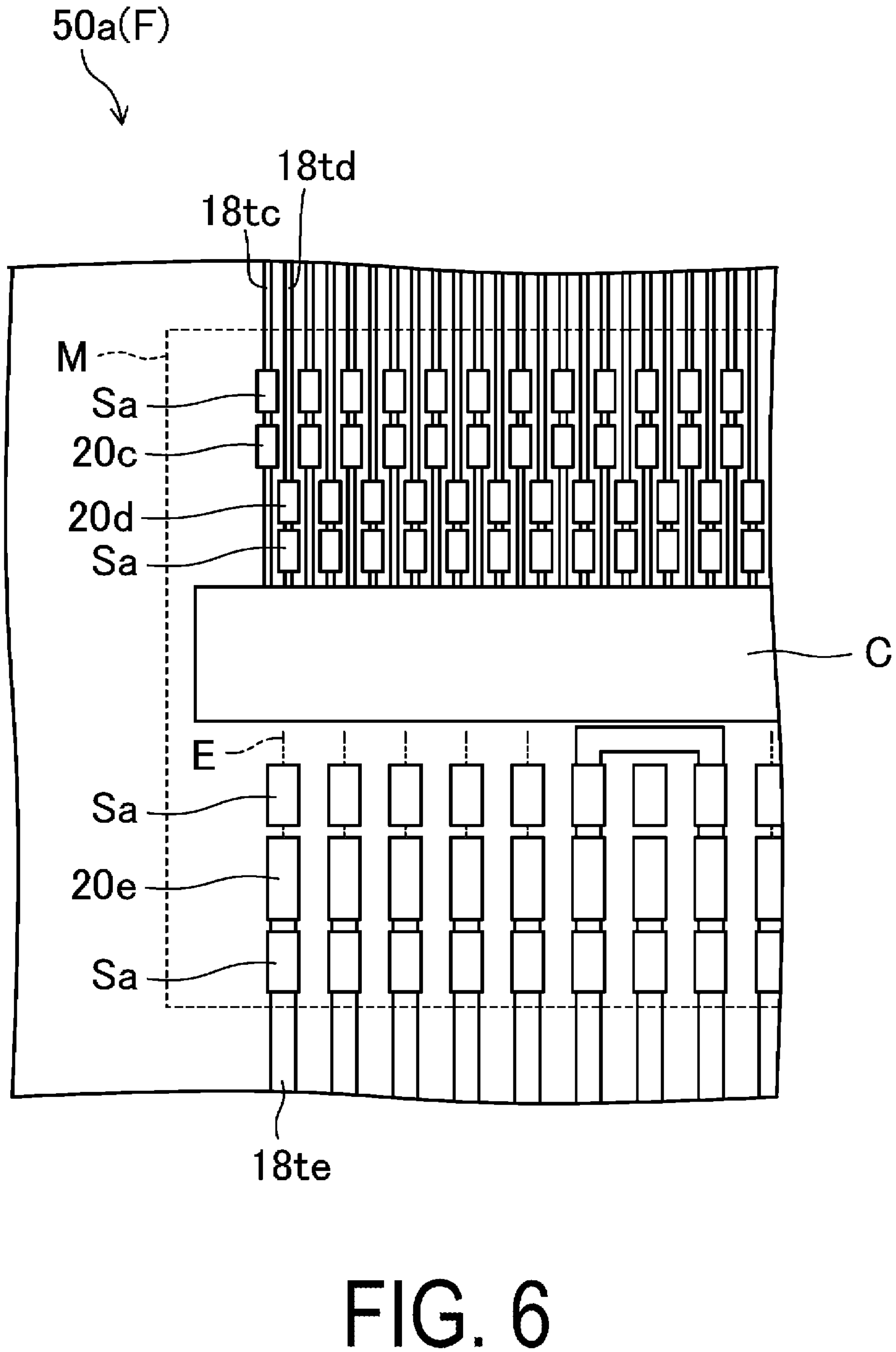
FIG. 6 is a plan view of a chip mounting portion in a frame region of the organic EL display panel of the organic EL display device according to the first embodiment of the disclosure and of the periphery of the chip mounting portion.
Figure 7:
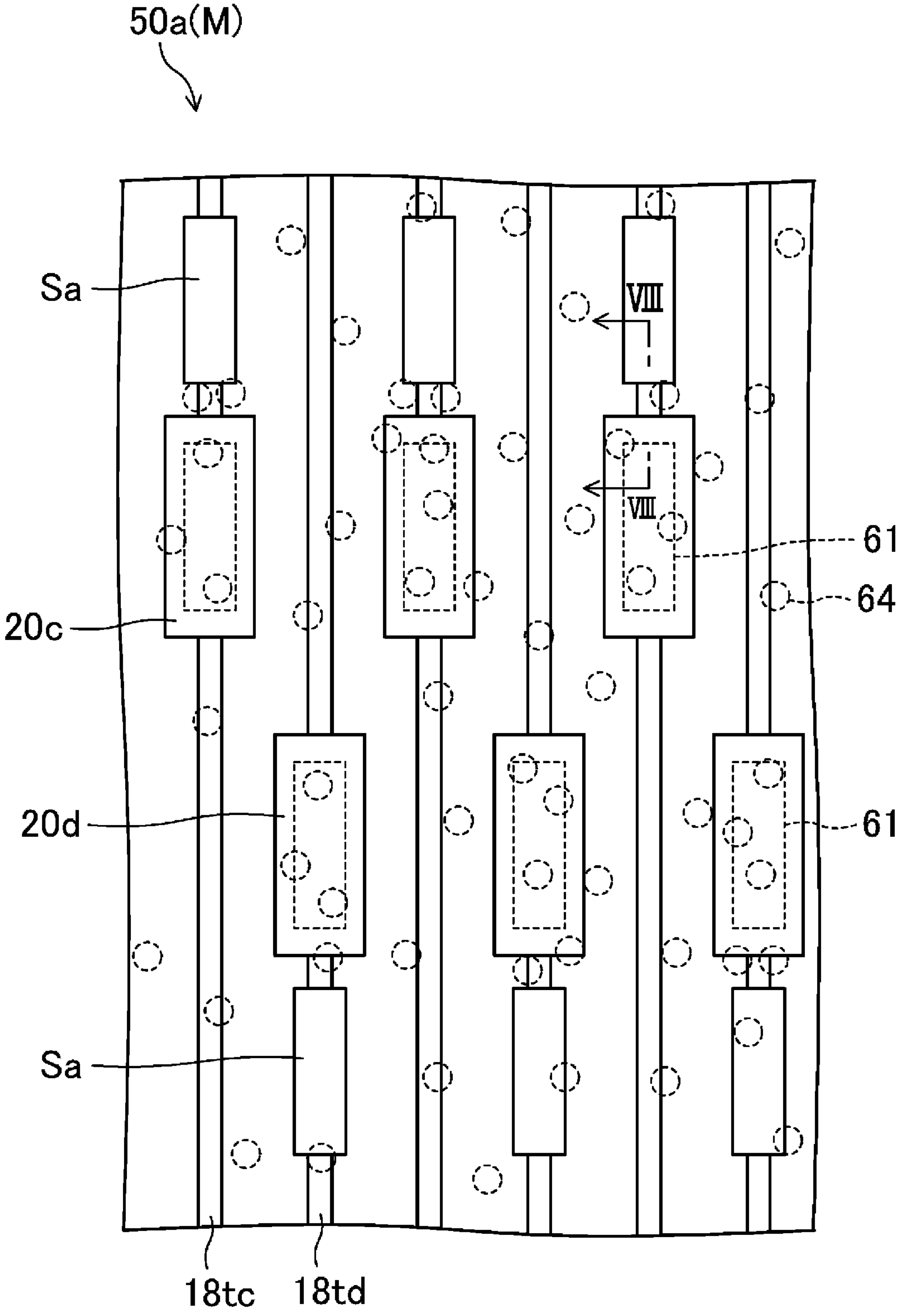
FIG. 7 is an enlarged plan view illustrating the chip mounting portion of the frame region of the organic EL display panel of the organic EL display device according to the first embodiment of the disclosure.
Figure 8:
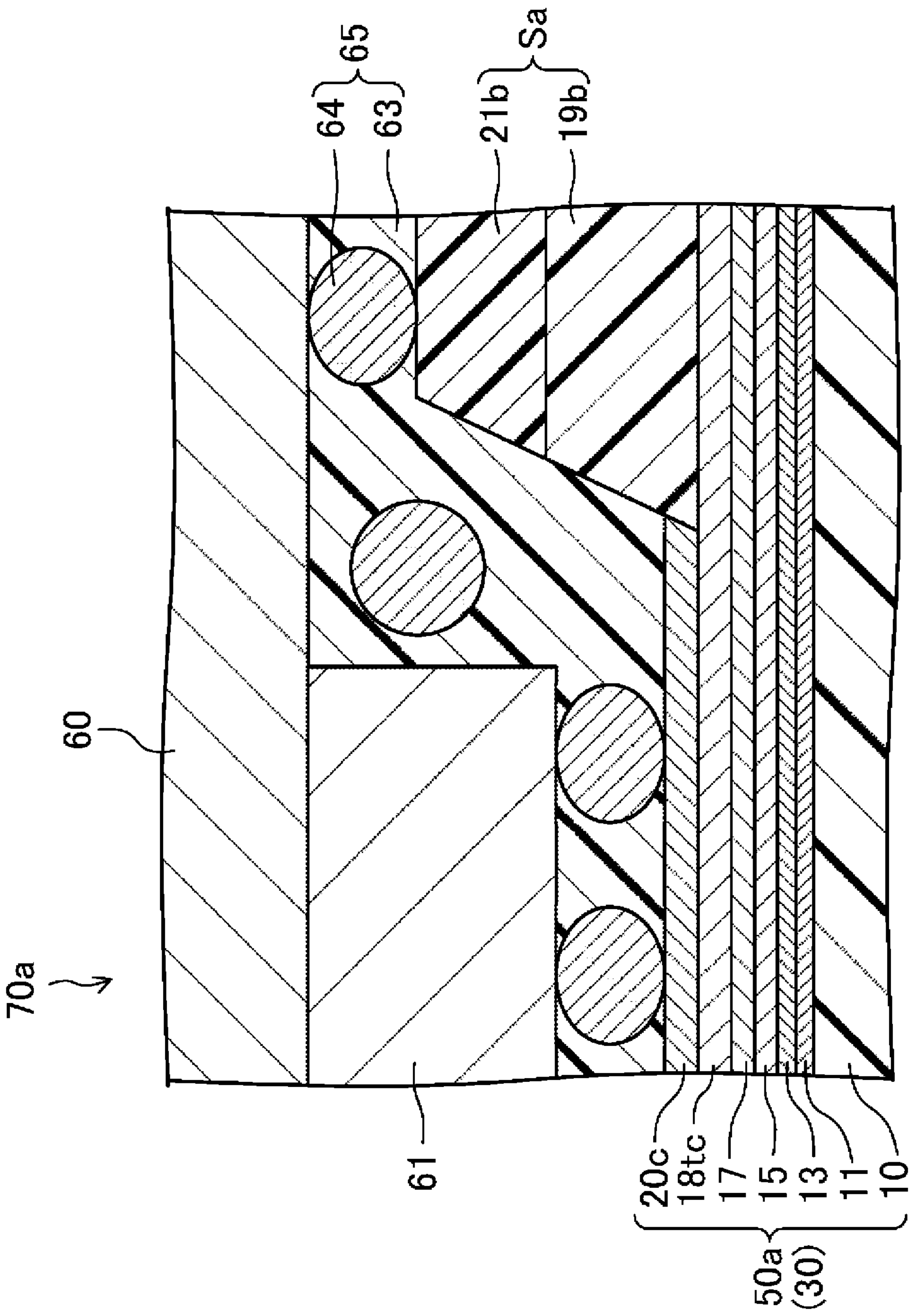
FIG. 8 is a cross-sectional view of the organic EL display device taken along line VIII-VIII in FIG. 7.

FIG. 1 to FIG. 8 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 70*a* according to the present embodiment. Further, FIGS. 2 and 3 are a plan view and a cross-sectional view of a display region D of an organic EL display panel 50*a* constituting the organic EL display device 70*a*. Further, FIG. 4 is an equivalent circuit diagram of a thin film transistor layer 30 constituting the organic EL display panel 50*a*. Further, FIG. 5 is a cross-sectional view illustrating an organic EL layer 33 constituting the organic EL display panel 50*a*. Further, FIG. 6 is a plan view of a chip mounting portion M in a frame region F of the organic EL display panel 50*a* and of the periphery of the chip mounting portion M. Further, FIG. 7 is an enlarged plan view of the chip mounting portion M in the frame region F of the organic EL display panel 50*a*. FIG. 8 is a cross-sectional view of the organic EL display device 70*a* taken along a line VIII-VIII in FIG. 7.

As illustrated in FIG. 1, the organic EL display device 70*a* includes an organic EL display panel 50*a*, an integrated circuit chip 60 mounted on the chip mounting portion M described below of the organic EL display panel 50*a*, and a flexible printed circuit 55 mounted on a terminal portion T described below of the organic EL display panel 50*a*.

As illustrated in FIG. 1, the organic EL display panel 50*a* includes, for example, the display region D that is provided in a rectangular shape and in which an image is displayed, and a frame region F provided in a frame-like shape surrounding the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, a plurality of subpixels P are arrayed in a matrix shape in the display region D. In addition, in the display region D, for example, a subpixel P including a red light-emitting region Lr for displaying a red color, a subpixel P including a green light-emitting region Lg for displaying a green color, and a subpixel P including a blue light-emitting region Lb for displaying a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D.

The terminal portion T is provided at a lower end portion of the frame region F in FIG. 1 in such a manner as to extend in one direction (lateral direction in the diagram). Further, as illustrated in FIG. 1, the chip mounting portion M is provided between the display region D and the terminal portion T in the frame region F so as to extend in one direction (lateral direction in the diagram). As illustrated in FIG. 1, the chip mounting portion M is provided in a rectangular shape in a plan view so as that the long sides extend in the extending direction of the terminal portion T.

As illustrated in FIG. 3, the organic EL display panel 50*a* includes a flexible substrate layer 10, a thin film transistor (hereinafter, also referred to as a TFT) layer 30 provided on the flexible substrate layer 10, an organic EL element layer 40 provided on the TFT layer 30 as a light-emitting element layer, and a sealing film 45 provided covering the organic EL element layer 40.

The flexible substrate layer 10 is formed, for example, of a polyimide resin and has flexibility. In the present embodiment described herein, the flexible substrate layer 10 made of a resin such as polyimide resin, but the flexible substrate layer 10 may be made of metal in the form of a metal film, a thin metal plate, or the like.

As illustrated in FIG. 3, the TFT layer 30 includes a base coat film 11 provided on the flexible substrate layer 10, a plurality of first TFTs 9*a*, a plurality of second TFTs 9*b* (see FIG. 4), a plurality of third TFTs 9*c*, and a plurality of capacitors 9*d* provided on the base coat film 11, and the first flattening film 19*a* and the second flattening film 21*a* sequentially provided on each of the first TFTs 9*a*, each of the second TFTs 9*b*, each of the third TFTs 9*c*, and each of the capacitors 9*d*.

In the TFT layer 30, as illustrated in FIG. 3, on the flexible substrate layer 10, the base coat film 11, a semiconductor pattern layer such as a semiconductor layer 12*a* described below, a gate insulating film 13, a first wiring line layer such as a gate line 14*g* described below, a first interlayer insulating film 15, a second wiring line layer such as an upper conductive layer 16*c* described below, a second interlayer insulating film 17, a third wiring line layer such as a source line 18*f* described below, a first flattening film 19*a*, a fourth wiring line layer such as a power source line 20*a*, and a second flattening film 21*a* are layered in order. For example, each of the base coat film 11, the gate insulating film 13, the first interlayer insulating film 15, and the second interlayer insulating film 17 is composed of a single-layer film or a layered film of an inorganic insulating film of silicon nitride, silicon oxide, silicon oxynitride, or the like.

As illustrated in FIGS. 2 and 4, in the TFT layer 30, a plurality of gate lines 14*g* are provided as the first wiring line layer so as to extend parallel to each other in a lateral direction in the drawings. In addition, in the TFT layer 30, as illustrated in FIGS. 2 and 4, a plurality of light emission control lines 14*e* are provided as the first wiring line layer so as to extend parallel to each other in the lateral direction in the drawings. Note that, as illustrated in FIG. 2, each of the light emission control lines 14*e* is provided adjacent to a corresponding one of the gate lines 14*g*. In the TFT layer 30, as illustrated in FIGS. 2 and 4, a plurality of the source lines 18*f* are provided as the third wiring line layer in such a manner as to extend parallel to each other in a longitudinal direction in the drawings. As illustrated in FIG. 3, in the TFT layer 30, the power source line 20*a* is provided in a lattice pattern as the fourth wiring line layer between the first flattening film 19*a* and the second flattening film 21*a*. In addition, in the TFT layer 30, as illustrated in FIG. 4, each subpixel P includes the first TFT 9*a*, the second TFT 9*b*, the third TFT 9*c*, and the capacitor 9*d*.

As illustrated in FIG. 4, the first TFT 9*a* is electrically connected to the corresponding gate line 14*g*, the corresponding source line 18*f*, and the corresponding second TFT 9*b* in each subpixel P. Additionally, as illustrated in FIG. 3, the first TFT 9*a* includes a semiconductor layer 12*a*, a gate insulating film 13, a gate electrode 14*a*, a first interlayer insulating film 15, a second interlayer insulating film 17, and a source electrode 18*a* and a drain electrode 18*b*, which are sequentially provided on the base coat film 11. Here, as illustrated in FIG. 3, the semiconductor layer 12*a* is provided in an island shape on the base coat film 11, and includes a channel region, a source region, and a drain region, as described below. Additionally, as illustrated in FIG. 3, the gate insulating film 13 is provided so as to cover the semiconductor layer 12*a*. Additionally, as illustrated in FIG. 3, the gate electrode 14*a* is provided on the gate insulating film 13 so as to overlap with the channel region of the semiconductor layer 12*a*. Additionally, as illustrated in FIG. 3, the first interlayer insulating film 15 and the second interlayer insulating film 17 are sequentially provided so as to cover the gate electrode 14*a*. Additionally, as illustrated in FIG. 3, the source electrode 18*a* and the drain electrode 18*b* are separated from each other on the second interlayer insulating film 17. Additionally, as illustrated in FIG. 3, the source electrode 18*a* and the drain electrode 18*b* are electrically connected to the source region and the drain region of the semiconductor layer 12*a*, respectively, via each contact hole formed in a layered film including the gate insulating film 13, the first interlayer insulating film 15, and the second interlayer insulating film 17.

As illustrated in FIG. 4, the second TFT 9*b* is electrically connected to the corresponding first TFT 9*a*, the corresponding power source line 20*a*, and the corresponding third TFT 9*c* in each subpixel P. Note that the second TFT 9*b* has substantially the same structure as the first TFT 9*a* and the third TFT 9*c* to be described later.

As illustrated in FIG. 4, the third TFT 9*c* is electrically connected to the corresponding second TFT 9*b*, a first electrode 31*a* of a corresponding organic EL element 35 described later, and the corresponding light emission control line 14*e* in each subpixel P. Additionally, as illustrated in FIG. 3, the third TFT 9*c* includes a semiconductor layer 12*b*, the gate insulating film 13, a gate electrode 14*b*, the first interlayer insulating film 15, the second interlayer insulating film 17, and a source electrode 18*c* and a drain electrode 18*d*, which are sequentially provided on the base coat film 11. Here, as illustrated in FIG. 3, the semiconductor layer 12*b* is provided in an island shape on the base coat film 11, and includes a channel region, a source region, and a drain region, as with the semiconductor layer 12*a*. Additionally, as illustrated in FIG. 3, the gate insulating film 13 is provided so as to cover the semiconductor layer 12*b*. Additionally, as illustrated in FIG. 3, the gate electrode 14*b* is provided on the gate insulating film 13 so as to overlap with the channel region of the semiconductor layer 12*b*. Additionally, as illustrated in FIG. 3, the first interlayer insulating film 15 and the second interlayer insulating film 17 are sequentially provided so as to cover the gate electrode 14*b*. Additionally, as illustrated in FIG. 3, the source electrode 18*c* and the drain electrode 18*d* are separated from each other on the second interlayer insulating film 17. Additionally, as illustrated in FIG. 3, the source electrode 18*c* and the drain electrode 18*d* are electrically connected to the source region and the drain region of the semiconductor layer 12*b*, respectively, via each contact hole formed in a layered film including the gate insulating film 13, the first interlayer insulating film 15, and the second interlayer insulating film 17.

Note that, in the present embodiment, the first TFT 9*a*, the second TFT 9*b*, and the third TFT 9*c* of a top gate type are exemplified, but the first TFT 9*a*, the second TFT 9*b*, and the third TFT 9*c* may be of a bottom gate type.

As illustrated in FIG. 4, the capacitor 9*d* is electrically connected to the corresponding first TFT 9*a* and the corresponding power source line 20*a* in each subpixel P. Here, the capacitor 9*d* includes, as illustrated in FIG. 3, a lower conductive layer 14*c* provided as the first wiring line layer, the first interlayer insulating film 15 provided so as to cover the lower conductive layer 14*c*, and the upper conductive layer 16*c* provided, as the second wiring line layer, on the first interlayer insulating film 15 so as to overlap with the lower conductive layer 14*c*. Note that the upper conductive layer 16*c* is electrically connected to the power source line 20*a* via a contact hole (not illustrated) formed in the second interlayer insulating film 17 and the first flattening film 19*a*.

The first flattening film 19*a* and the second flattening film 21*a* have a flat surface in the display region D, and are formed of, for example, an organic resin material such as a polyimide resin or an acrylic resin, or a polysiloxane-based spin on glass (SOG) material. Here, as illustrated in FIG. 3, between the first flattening film 19*a* and the second flattening film 21*a*, a relay electrode 20*b* is provided as the fourth wiring line layer in addition to the power source line 20*a* described above.

The organic EL element layer 40 includes a plurality of the first electrodes 31*a*, a common edge cover 32*a*, a plurality of the organic EL layers 33, and a common second electrode 34 provided in that order corresponding to the plurality of subpixels P. Here, in each of the subpixels P, the first electrode 31*a*, the organic EL layer 33, and the second electrode 34 constitute the organic EL element 35 (see FIG. 4), and in the organic EL element layer 40, a plurality of the organic EL elements 35 are arranged in a matrix shape.

As illustrated in FIG. 3, the plurality of first electrodes 31*a* are provided in a matrix shape on the second flattening film 21*a* so as to correspond to the plurality of subpixels P. As illustrated in FIG. 3, the first electrode 31*a* is electrically connected to the drain electrode 18*d* of each third TFT 9*c* via a contact hole formed in the first flattening film 19*a*, the relay electrode 20*b*, and a contact hole formed in the second flattening film 21*a*. Additionally, the first electrode 31*a* has a function to inject a hole (positive hole) into each of the organic EL layers 33. Additionally, the first electrode 31*a* is preferably formed of a material having a high work function to improve hole injection efficiency into the organic EL layer 33. Here, examples of a material constituting the first electrode 31*a* include a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), tin (Sn) and the like. Examples of the material of the first electrode 31*a* also include an alloy such as astatine (At)/astatine oxide ($AtO_2$). Further, the material constituting the first electrode 31*a* may be, for example, an electrically conductive oxide such as tin oxide (SnO), zinc oxide (ZnO), indium tin oxide (ITO), indium zinc oxide (IZO) and the like. Additionally, the first electrode 31*a* may be formed by layering a plurality of layers including any of the materials described above. Note that examples of compound materials having a high work function include indium tin oxide (ITO) and indium zinc oxide (IZO).

As illustrated in FIG. 3, the edge cover 32*a* is provided in a lattice pattern, and covers a peripheral end portion of each of the first electrodes 31*a*. The edge cover 32*a* is formed of, for example, an organic resin material such as a polyimide resin or an acrylic resin, or a polysiloxane-based SOG material.

As illustrated in FIG. 3, the plurality of organic EL layers 33 are disposed on each of the first electrodes 31*a*, and provided in a matrix shape and correspond to the plurality of subpixels P. Here, as illustrated in FIG. 5, each of the organic EL layers 33 includes a hole injection layer 1, a hole transport layer 2, a light-emitting layer 3, an electron transport layer 4, and an electron injection layer 5, which are sequentially provided on the first electrode 31*a*.

The hole injection layer 1 is also referred to as an anode electrode buffer layer, and has a function to reduce an energy level difference between the first electrode 31*a* and the organic EL layer 33 and to improve hole injection efficiency from the first electrode 31*a* into the organic EL layer 33. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function to improve hole transport efficiency from the first electrode 31*a* to the organic EL layer 33. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where, when a voltage is applied by the first electrode 31*a* and the second electrode 34, a positive bole and an electron are injected from the first electrode 31*a* and the second electrode 34, respectively, and the positive hole and the electron are recombined. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of facilitating migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 34 and the organic EL layer 33 to thereby improve the efficiency of electron injection into the organic EL layer 33 from the second electrode 34, and this function allows the drive voltage of the organic EL element to be reduced. Note that the electron injection layer 5 is also referred to as a cathode electrode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

The second electrode 34 is provided on the plurality of organic EL layers 33 so as to be common to the plurality of subpixels P, that is, the second electrode 34*a* is provided to cover each of organic EL layers 33 and the edge cover 32*a*, as illustrated in FIG. 3. Further, the second electrode 34 functions to inject electrons into the organic EL layer 33. Further, the second electrode 34 is preferably formed of a material having a low work function to improve the efficiency of electron injection into the organic EL layer 33. Here, examples of a material constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be formed of alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 40 is provided to cover the second electrode 34, and includes a first inorganic sealing film 41, an organic sealing film 42, and a second inorganic sealing film 43 sequentially layered on the second electrode 34, and has a function to protect the organic EL layer 33 of the organic EL element 35 from moisture and oxygen. Here, the first inorganic sealing film 41 and the second inorganic sealing film 43 include, for example, an inorganic insulating film such as a silicon nitride film, a silicon oxide film, and a silicon oxynitride film. Additionally, the organic sealing film 42 is made of, for example, an organic resin material such as an acrylic resin, an epoxy resin, a silicone resin, a polyurea resin, a parylene resin, a polyimide resin, and a polyamide resin. Note that in the frame region F of the organic EL display panel 50*a*, a first dam wall for suppressing the spread of ink corresponding to the organic sealing film 42 is provided in a frame-like shape surrounding the display region D, and a second dam wall is provided in a frame-like shape surround the first dam wall.

As illustrated in FIG. 6, the organic EL display panel 50*a* includes, in the chip mounting portion M of the frame region F, an under-chip circuit portion C provided in a rectangular shape extending in the lateral direction in the diagram, a plurality of output-side terminal wiring lines 18*tc* and a plurality of output-side terminal wiring lines 18*td* provided extending parallel to one another on the display region D side (upper side in the diagram) of the under-chip circuit portion C, and a plurality of input-side terminal wiring lines 18*te* provided extending parallel to one another on the terminal portion T side (lower side in the diagram) of the under-chip circuit portion C. As illustrated in FIGS. 6 and 7, the plurality of output-side terminal wiring lines 18*tc* and the plurality of output-side terminal wiring lines 18*td* are alternately provided in the extending direction (lateral direction in the diagram) of the chip mounting portion M. Note that the output-side terminal wiring lines 18*te*, the output-side terminal wiring lines 18*td*, and the input-side terminal wiring lines 18*te* are provided as the third wiring line layer.

As illustrated in FIG. 6, the organic EL display panel 50*a* includes, in the chip mounting portion M of the frame region F, a plurality of first output terminals 20*c* provided on the display region D side (upper side in the diagram) arranged in a row as a chip terminal on the display region D side of the under-chip circuit portion C, a plurality of second output terminals 20*d* provided on the terminal portion T side (lower side in the diagram) arranged in a row as a chip terminal on the display region D side of the under-chip circuit portion C, and a plurality of input terminals 20*e* arranged in a row as a chip terminal on the terminal portion T side (lower side in the diagram) of the under-chip circuit portion C. As illustrated in FIGS. 6 and 7, the plurality of first output terminals 20*c* and the plurality of second output terminals 20*d* are provided in a zig-zag shape in the extending direction (lateral direction in the diagram) of the chip mounting portion M. Note that the first output terminals 20*c*, the second output terminals 20*d*, and the input terminals 20*e* are provided as the fourth wiring line layer. As illustrated in FIG. 8, the plurality of first output terminals 20*c* are layered on the plurality of output-side terminal wiring lines 18*tc* and are electrically connected to the plurality of output-side terminal wiring lines 18*tc*. Also, the plurality of second output terminals 20*d* are layered on the plurality of output-side terminal wiring lines 18*td* and are electrically connected to the plurality of output-side terminal wiring lines 18*td*. The plurality of input terminals 20*e* are layered on the plurality of input-side terminal wiring lines 18*te* and are electrically connected to the plurality of input-side terminal wiring lines 18*te*.

As illustrated in FIG. 6, the organic EL display panel 50*a* includes, in the chip mounting portion M of the frame region F, for each chip terminal including the plurality of first output terminals 20*c*, the plurality of second output terminals 20*d*, and the plurality of input terminals 20*e*, a chip support body Sa is provided in an island shape at each terminal wiring line overlapping the output-side terminal wiring line 18*tc*, the output-side terminal wiring line 18*td*, and the input-side terminal wiring line 18*te* corresponding to the chip terminal or an extension line E of the terminal wiring line. As illustrated in FIG. 8, the chip support body Sa includes a lower resin layer 19*b* formed of the same material as the first flattening film 19*a* in the same layer and an upper resin layer 21*b* provided on the lower resin layer 19*b* and formed of the same material as the second flattening film 21*a* in the same layer. As illustrated in FIGS. 6 and 7, for each first output terminal 20*c*, the chip support body Sa is provided on the display region D side (upper side in the diagram) of the first output terminal 20*c*, and for each second output terminal 20*d*, the chip support body Sa is provided on the terminal portion T side (lower side in the diagram) of the second output terminal 20*d*. Also, as illustrated in FIG. 6, a pair of the chip support bodies Sa are provided for each input terminal 20*e* with the pair of chip support bodies Sa sandwiching the input terminal 20*e*. In the chip support body arrangement example according to the present embodiment described above, the chip support body Sa is provided for each chip terminal. However, the chip support body Sa may be provided for at least one of a plurality of chip terminals.

As illustrated in FIG. 8, a plurality of bumps 61 are provided on the back surface of the integrated circuit chip 60. As illustrated in FIG. 7, the plurality of chip terminals including the plurality of first output terminals 20*c*, the plurality of second output terminals 20*d*, and the plurality of input terminals 20*e* provided in the chip mounting portion M of the frame region F of the organic EL display panel 50*a* are provided so as to correspond to the plurality of bumps 61. In addition, as illustrated in FIGS. 7 and 8, the plurality of chip terminals (the first output terminals 20*c*, the second output terminals 20*d*, and the input terminals 20*e*) and the plurality of bumps 61 are interposed by an anisotropic conductive film 65 and specifically are electrically connected to one another via the conductive particles 64 in the anisotropic conductive film 65. As illustrated in FIG. 8, the anisotropic conductive film 65 includes, for example, a resin material 63 made of a thermosetting resin and the conductive particles 64 dispersed in the resin material 63.

The flexible printed circuit (FPC) 55 is mounted at the terminal portion T via the anisotropic conductive film 65.

In the organic EL display device 70*a* described above, in each of the subpixels P, by inputting a gate signal to the first TFT 9*a* via the gate line 14*g*, the first TFT 9*a* is turned on. When a predetermined voltage corresponding to a source signal is written to the gate electrode of the second TFT 9*b* and the capacitor 9*d* via the source line 18*f*, and a light emission control signal is input to the third TFT 9*c* via the light emission control line 14*e*, the third TFT 9*c* is turned on. Then, by supplying a current corresponding to the gate voltage of the second TFT 9*b* from the power source line 20*a* to the organic EL layer 33, the light-emitting layer 3 of the organic EL layer 33 emits light to display an image. Note that, in the organic EL display device 70*a*, even when the first TFT 9*a* is turned off, the gate voltage of the second TFT 9*b* is held by the capacitor 9*d*, and thus, light emission by the light-emitting layer 3 is maintained in each of the subpixels P until a gate signal of the next frame is input.

Next, a method for manufacturing the organic EL display device 70*a* according to the present embodiment will be described. Note that the method for manufacturing an organic EL display device according to the present embodiment includes a TFT layer forming step, an organic EL display panel preparing step including an organic EL element layer forming step and a sealing film forming step, and a mounting step.

Organic EL Display Panel Preparing Step

TFT Layer Forming Step

First, for example, a non-photosensitive polyimide resin (having a thickness of approximately 10 μm) is applied onto a glass substrate, and then the applied film is prebaked and postbaked to form the flexible substrate layer 10.

Thereafter, a silicon oxide film (having a thickness of approximately 500 nm) and a silicon nitride film (having a thickness of approximately 100 nm) are sequentially formed, for example, by a plasma CVD method, on the substrate surface formed with the flexible substrate layer 10 to form the base coat film 11.

Subsequently, for example, an amorphous silicon film (having a thickness of approximately 50 nm) is formed on the substrate surface formed with the base coat film 11, by plasma CVD, the amorphous silicon film is crystallized by laser annealing or the like to form a semiconductor film of a polysilicon film, and then, the semiconductor film is patterned to form a semiconductor pattern layer such as the semiconductor layer 12*a* or the like.

Thereafter, an inorganic insulating film (approximately 100 nm) such as a silicon oxide film is formed on the substrate surface formed with the semiconductor pattern layer, for example, by plasma CVD, to form the gate insulating film 13 to cover the semiconductor layer 12*a* and the like.

Also, a molybdenum film (having a thickness of approximately 250 nm) is formed by, for example, a sputtering method, on the substrate surface formed with the gate insulating film 13. Then, the molybdenum film is patterned to form the first wiring line layer of the gate line 14*g* and the like.

Subsequently, using the first wiring line layer as a mask, impurity ions are doped to form an intrinsic region and a conductor region in the semiconductor layer 12*a* and the like.

Thereafter, a silicon nitride film (having thickness of approximately 100 nm) is formed on the substrate surface formed with the semiconductor layers 12*a* and the like with the intrinsic region and the conductor region, for example, by plasma CVD to form the first interlayer insulating film 15.

Subsequently, a molybdenum film (having a thickness of approximately 250 nm) is formed by, for example, a sputtering method, on the substrate surface formed with the first interlayer insulating film 15, and then, the molybdenum film is patterned to form the second wiring line layer of the upper conductive layer 16*c* and the like.

Furthermore, a silicon oxide film (having a thickness of approximately 300 nm) and a silicon nitride film (having a thickness of approximately 200 nm) are formed in order, by, for example, a plasma CVD method, on the substrate surface formed with the second wiring line layer to form the second interlayer insulating film 17.

Thereafter, the gate insulating film 13, the first interlayer insulating film 15, and the second interlayer insulating film 17 are patterned to form a contact hole.

Also, a titanium film (having a thickness of approximately 50 nm), an aluminum film (having a thickness of approximately 600 nm), and a titanium film (having a thickness of approximately 50 nm) are sequentially formed by, for example, a sputtering method, on the substrate surface formed with the above-described contact hole, and then, a metal layered film thereof is patterned to form the third wiring line layer of the source line 18*f* and the like.

Further, a photosensitive polyimide resin (having a thickness of approximately 2.5 μm) is applied, by, for example, a spin coating method or a slit coating method, onto the substrate surface formed with the third wiring line layer, and then the applied film is prebaked, exposed, developed, and postbaked to form the first flattening film 19*a*, the lower resin layer 19*b*, and the like.

Thereafter, a titanium film (having a thickness of approximately 50 nm), an aluminum film (having a thickness of approximately 600 nm), a titanium film (having thickness of approximately 50 nm) are sequentially formed on the substrate surface formed with the first flattening film 19*a* and the like by, for example, a sputtering method, and then, a metal layered film thereof is patterned to form the fourth wiring line layer of the power source line 20*a*.

Finally, a polyimide-based photosensitive resin film (having a thickness of approximately 2.5 μm) is applied onto the substrate surface formed with the fourth wiring line layer, for example, by spin coating or slit coating, and then, the applied film is prebaked, exposed, developed, and postbaked to form the second flattening film 21*a*, the upper resin layer 21*b*, and the like.

As described above, the TFT layer 30 can be formed.

Organic EL Element Layer Forming Step

On the second flattening film 21*a* of the TFT layer 30 formed in the TFT layer forming step described above, the first electrode 31*a*, the edge cover 32*a*, the organic EL layer 33 (the hole injection layer 1, the hole transport layer 2, the light-emitting layer 3, the electron transport layer 4, and the electron injection layer 5), and the second electrode 34 are formed using a known method to form the organic EL element layer 40.

Sealing Film Forming Step

First, an inorganic insulating film such as a silicon nitride film, a silicon oxide film, or a silicon oxynitride film is formed by plasma CVD on a substrate surface formed with the organic EL element layer 40 formed in the organic EL element layer forming step by using a mask to form the first inorganic sealing film 41.

Next, on the substrate surface formed with the first inorganic scaling film 41, a film made of an organic resin material such as acrylic resin is formed by, for example, using an ink-jet method to form the organic sealing film 42.

Next, an inorganic insulating film such as a silicon nitride film, a silicon oxide film, or a silicon oxynitride film is formed by plasma CVD on the substrate surface formed with the organic sealing film 42 by using a mask to form the second inorganic sealing film 43, thereby forming the sealing film 45.

Also, after a protective sheet (not illustrated) on the front surface side is applied to the substrate surface formed with the scaling film 45, the glass substrate is peeled off from the lower surface of the flexible substrate layer 10 by irradiating laser light from the glass substrate side of the flexible substrate layer 10, and then a protective sheet (not illustrated) on the back surface side is applied to the lower surface of the flexible substrate layer 10 from which the glass substrate has been peeled off.

The organic EL display panel 50*a* can be prepared as described above.

Mounting Step

First, the protective sheet on the front surface side of the organic EL display panel 50*a* prepared in the organic EL display panel preparing step is partially removed by, for example, irradiating the protective sheet with laser light to expose the chip mounting portion M and the terminal portion T.

Subsequently, the anisotropic conductive film 65 is temporarily fixed to the chip mounting portion M and the terminal portion T.

Further, after the integrated circuit chip 60 and the flexible printed circuit 55 are aligned with the chip mounting portion M and the terminal portion T, respectively, a compression bonding tool is used to press the integrated circuit chip 60 and the flexible printed circuit 55 and mount the integrated circuit chip 60 and the flexible printed circuit 55 on the chip mounting portion M and the terminal portion T, respectively.

Thus, the organic EL display device 70*a* of the present embodiment can be manufactured as described above.

As described above, according to the organic EL display device 70*a* of the present embodiment, in the chip mounting portion M of the frame region F, for each chip terminal including the plurality of first output terminals 20*c*, the plurality of second output terminals 20*d*, and the plurality of input terminals 20*e*, the chip support body Sa is provided in an island shape at each terminal wiring line overlapping the output-side terminal wiring line 18_tc_, the output-side terminal wiring line 18_td_, and the input-side terminal wiring line 18_te_ corresponding to the chip terminal or the extension line E of the terminal wiring line. This makes it difficult for the conductive particles 64 to clump together between chip support bodies Sa and the adjacently-disposed bumps 61. Thus, short-circuiting between the adjacent terminals due to the conductive particles 64 forming a connection can be suppressed, and short-circuiting between the terminals in the chip mounting portion M can be suppressed.

Also, according to the organic EL display device 70_a_ of the present embodiment, in the chip mounting portion M of the frame region F, the chip support bodies Sa are provided at or near the chip terminals including the plurality of first output terminals 20_c_, the plurality of second output terminals 20_d_, and the plurality of input terminals 20_e_. Thus, deflection of the organic EL display panel 50_a_ at or near the bumps 61 of the integrated circuit chip 60 in the mounting step can be suppressed. In this manner, cracking in the base coat film 11, the gate insulating film 13, the first interlayer insulating film 15, and the second interlayer insulating film 17 of the organic EL display panel SOa can be suppressed, and disconnection of the output-side terminal wiring lines 18_tc_, the output-side terminal wiring lines 18_td_, and the input-side terminal wiring lines 18_te_ provided on the second interlayer insulating film 17 can be suppressed.

SECOND EMBODIMENT

Figure 9:
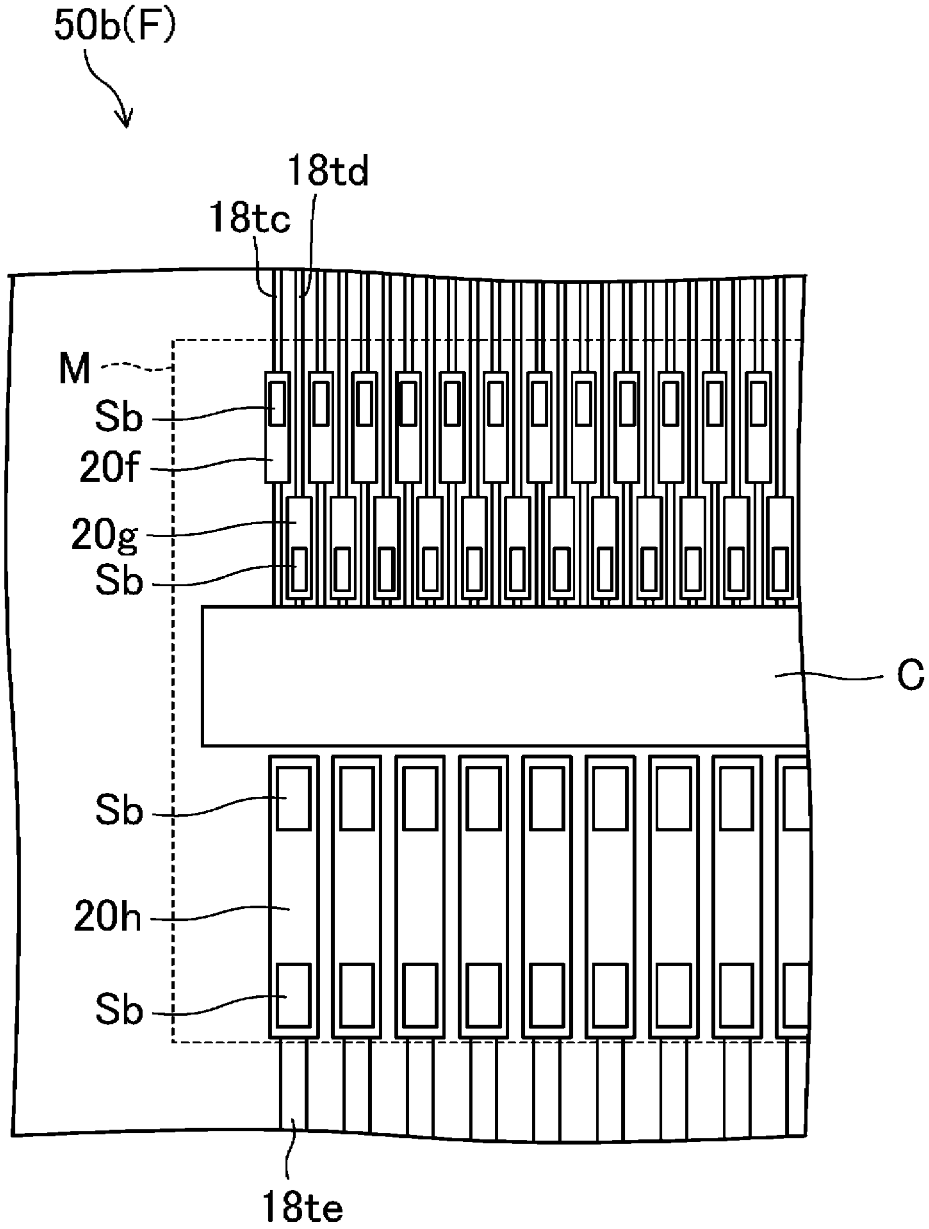
FIG. 9 corresponds to FIG. 6 and is a plan view of the chip mounting portion of the frame region of an organic EL display panel constituting an organic EL display device according to a second embodiment of the disclosure and of the periphery of the chip mounting portion.
Figure 10:
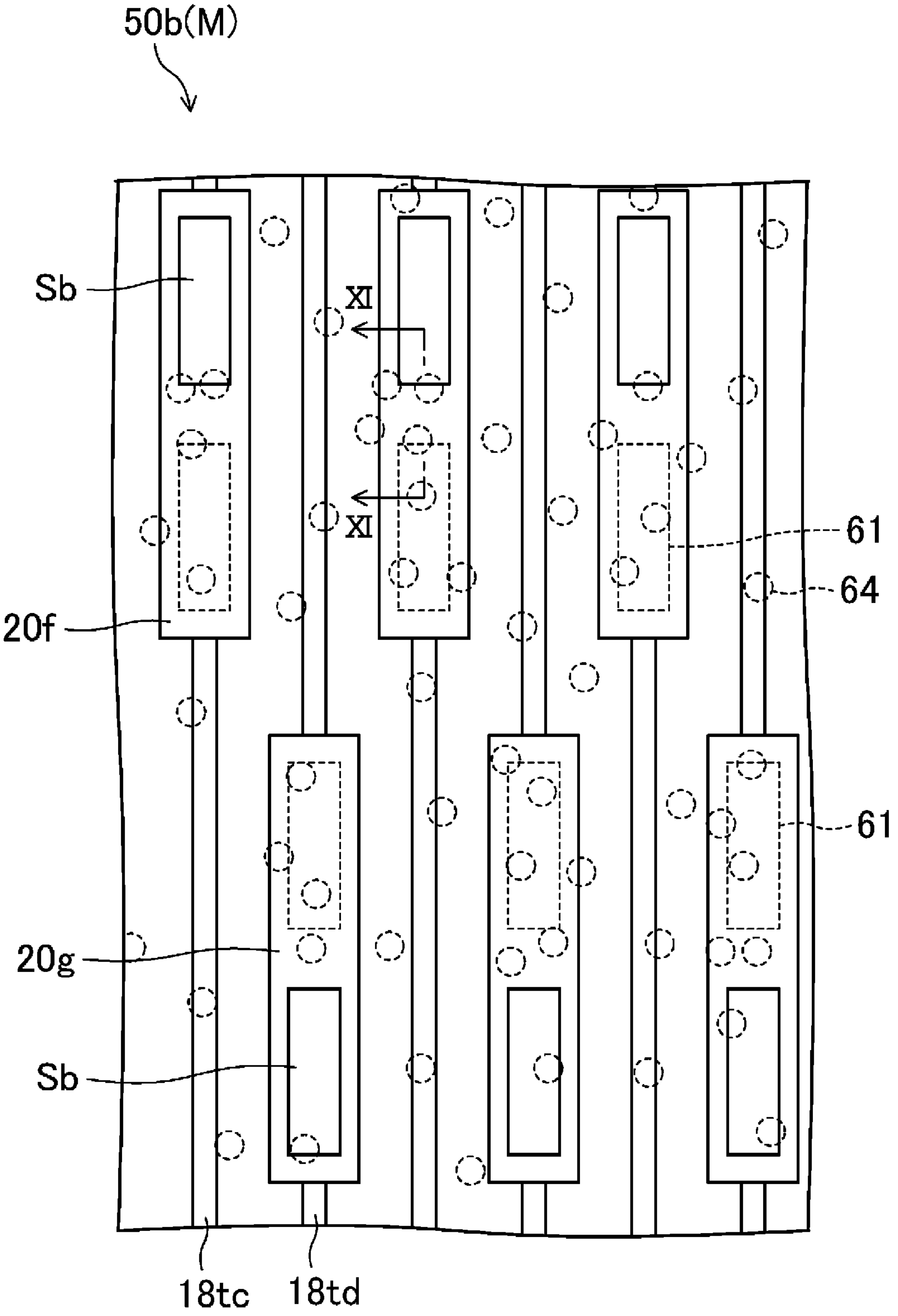
FIG. 10 corresponds to FIG. 7 and is an enlarged plan view of the chip mounting portion of the frame region of the organic EL display panel constituting the organic EL display device according to the second embodiment of the disclosure.
Figure 11:
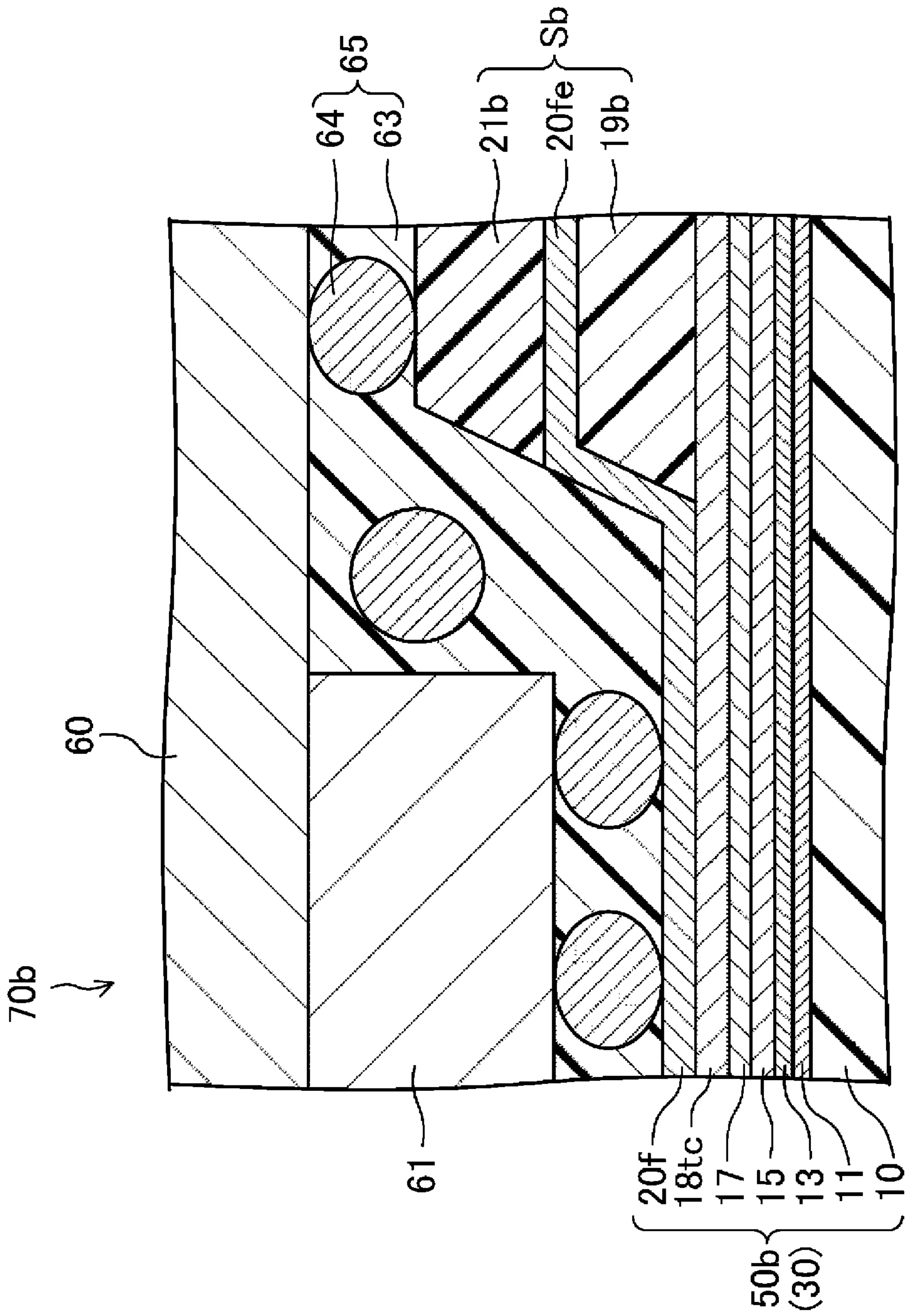
FIG. 11 is a cross-sectional view of the organic EL display device taken along line XI-XI in FIG. 10.

FIGS. 9 to 11 illustrate a second embodiment of a display device according to the disclosure. Here, FIG. 9 corresponds to FIG. 6 and is a plan view of the chip mounting portion M of the frame region F of an organic EL display panel 50_b_ constituting an organic EL display device 70_b_ according to the present embodiment and of the periphery of the chip mounting portion M. Also, FIG. 10 corresponds to FIG. 7 and is an enlarged plan view of the chip mounting portion M of the frame region F of the organic EL display panel 50_b_ constituting the organic EL display device 70_b_ according to the present embodiment. Additionally, FIG. 11 is a cross-sectional view of the organic EL display device 70_b_ taken along line XI-XI in FIG. 10. Note that, in each of the following embodiments, the same portions as those in FIG. 1 to FIG. 8 are denoted by the same reference signs, and the detailed description of these portions are omitted.

In the first embodiment described above, the organic EL display device 70_a_ includes the dual-layer-structured chip support body Sa. However, in the present embodiment described below, the organic EL display device 70_b_ include a triple-layer-structured chip support body Sb.

As with the organic EL display device 70_a_ of the first embodiment, the organic EL display device 70_b_ includes an organic EL display panel 50_b_, the integrated circuit chip 60 mounted on the chip mounting portion M of the organic EL display panel 50_b_, and the flexible printed circuit 55 mounted on the terminal portion T of the organic EL display panel 50_b_.

As with the organic EL display panel 50_a_ of the first embodiment described above, the organic EL display panel 50_b_ includes the display region D provided in a rectangular shape in which an image is displayed and the frame region F provided in a frame-like shape in a periphery of the display region D.

As with the organic EL display panel 50_a_ of the first embodiment described above, the organic EL display panel 50_b_ includes the flexible substrate layer 10, the TFT layer 30 provided on the flexible substrate layer 10, the organic EL element layer 40 provided on the TFT layer 30, and the sealing film 45 provided covering the organic EL element layer 40.

As illustrated in FIG. 9, the organic EL display panel 50_b_ includes, in the chip mounting portion M of the frame region F, the under-chip circuit portion C provided in a rectangular shape extending in the lateral direction in the diagram, the plurality of output-side terminal wiring lines 18_tc_ and the plurality of output-side terminal wiring lines 18_td_ provided extending parallel to one another on the display region D side (upper side in the diagram) of the under-chip circuit portion C, and the plurality of input-side terminal wiring lines 18_te_ provided extending parallel to one another on the terminal portion T side (lower side in the diagram) of the under-chip circuit portion C.

As illustrated in FIG. 9, the organic EL display panel 50_b_ includes, in the chip mounting portion M of the frame region F, a plurality of first output terminals 20_f_ provided on the display region D side (upper side in the diagram) arranged in a row as a chip terminal on the display region D side of the under-chip circuit portion C, a plurality of second output terminals 20_g_ provided on the terminal portion T side (lower side in the diagram) arranged in a row as a chip terminal on the display region D side of the under-chip circuit portion C, and a plurality of input terminals 20_h_ arranged in a row as a chip terminal on the terminal portion T side (lower side in the diagram) of the under-chip circuit portion C. As illustrated in FIGS. 9 and 10, the plurality of first output terminals 20_f_ and the plurality of second output terminals 20_g_ are provided in a zig-zag shape in the extending direction (lateral direction in the diagram) of the chip mounting portion M. Note that the first output terminals 20_f_, the second output terminals 20_g_, and the input terminals 20_h_ are provided as the fourth wiring line layer. As illustrated in FIG. 11, the plurality of first output terminals 20_f_ are layered on the plurality of output-side terminal wiring lines 18_tc_ and are electrically connected to the plurality of output-side terminal wiring lines 18_tc_. Also, the plurality of second output terminals 20_g_ are layered on the plurality of output-side terminal wiring lines 18_td_ and are electrically connected to the plurality of output-side terminal wiring lines 18_td_. The plurality of input terminals 20_h_ are layered on the plurality of input-side terminal wiring lines 18_te_ and are electrically connected to the plurality of input-side terminal wiring lines 18_te_.

As illustrated in FIG. 9, the organic EL display panel 50_b_ includes, in the chip mounting portion M of the frame region F, for each chip terminal including the plurality of first output terminals 20_f_, the plurality of second output terminals 20_g_, and the plurality of input terminals 20_h_, the chip support body Sb is provided in an island shape at each terminal wiring line overlapping the output-side terminal wiring line 18_tc_, the output-side terminal wiring line 18_td_, and the input-side terminal wiring line 18_te_ corresponding to the chip terminal. As illustrated in FIG. 11, the chip support body Sb includes the lower resin layer 19_b_ formed of the same material as the first flattening film 19_a_ in the same layer, a metal layer 20_fe_ provided on the lower resin layer 19_b_, and the upper resin layer 21_b_ provided on the metal layer 20_fe_ and formed of the same material as the second flattening film 21_a_ in the same layer. The metal layer 20_fe_ is an extension portion of the first output terminal 20_f_. As illustrated in FIGS. 9 and 10, for each first output terminal 20_f_, the chip support body Sb is provided on the display region D side (upper side in the diagram) of the first output terminal 20_f_, and for each second output terminal 20_g_, the chip support body Sb is provided on the terminal portion T side (lower side in the diagram) of the second output terminal 20*g*. As illustrated in FIG. 9, for each input terminal 20*h*, the chip support body Sb is provided as a pair on the display region D side (upper side in the diagram) and the terminal portion T side (lower side in the diagram) of the input terminal 20*h*. In the chip support body arrangement example according to the present embodiment described above, the chip support body Sb is provided for each chip terminal. However, the chip support body Sb may be provided for at least one of a plurality of chip terminals.

As illustrated in FIG. 11, the plurality of bumps 61 are provided on the back surface of the integrated circuit chip 60. As illustrated in FIG. 10, the plurality of chip terminals including the plurality of first output terminals 20*f*, the plurality of second output terminals 20*g*, and the plurality of input terminals 20*h* provided in the chip mounting portion M of the frame region F of the organic EL display panel 50*b* are provided so as to correspond to the plurality of bumps 61. In addition, as illustrated in FIGS. 10 and 11, the plurality of chip terminals (the first output terminals 20*f*, the second output terminals 20*g*, and the input terminals 20*h*) and the plurality of bumps 61 are interposed by the anisotropic conductive film 65 and specifically are electrically connected to one another via the conductive particles 64 in the anisotropic conductive film 65.

As with the organic EL display device 70*a* of the first embodiment described above, the organic EL display device 70*b* described above has flexibility and is configured to display an image by causing the light-emitting layer 3 of the organic EL layer 33 to emit light as appropriate via the first TFT 9*a*, the second TFT 9*b*, and the third TFT 9*c* in each subpixel P.

The organic EL display device 70*b* of the present embodiment can be manufactured by modifying the pattern shapes of the fourth wiring line layer in the manufacturing method for the organic EL display device 70*a* of the first embodiment.

As described above, according to the organic EL display device 70*b* of the present embodiment, in the chip mounting portion M of the frame region F, for each chip terminal including the plurality of first output terminals 20*f*, the plurality of second output terminals 20*g*, and the plurality of input terminals 20*h*, the chip support body Sb is provided in an island shape at each terminal wiring line overlapping the output-side terminal wiring line 18*tc*, the output-side terminal wiring line 18*td*, and the input-side terminal wiring line 18*te* corresponding to the chip terminal. This makes it difficult for the conductive particles 64 to clump together between chip support bodies Sb and the adjacently-disposed bumps 61. Thus, short-circuiting between the adjacent terminals due to the conductive particles 64 forming a connection can be suppressed, and short-circuiting between the terminals in the chip mounting portion M can be suppressed.

In addition, according to the organic EL display device 70*b* of the present embodiment, the height of the chip support body Sb is increased by an amount corresponding to the thickness of the first output terminal 20*f*, the second output terminal 20*g*, and the input terminal 20*h*. This allows the dispersion effect of the conductive particles 64 in the anisotropic conductive film 65 to be increased. This makes it more difficult for the conductive particles 64 to clump together between chip support bodies Sb and the adjacently-disposed bumps 61. Thus, short-circuiting between the adjacent terminals due to the conductive particles 64 forming a connection can be further suppressed, and short-circuiting between the terminals in the chip mounting portion M can be further suppressed.

Also, according to the organic EL display device 70*b* of the present embodiment, in the chip mounting portion M of the frame region F, the chip support bodies Sb are provided at or near the chip terminals including the plurality of first output terminals 20*f*, the plurality of second output terminals 20*g*, and the plurality of input terminals 20*h*. Thus, deflection of the organic EL display panel 50*b* at or near the bumps 61 of the integrated circuit chip 60 in the mounting step can be suppressed. In this manner, cracking in the base coat film 11, the gate insulating film 13, the first interlayer insulating film 15, and the second interlayer insulating film 17 of the organic EL display panel 50*b* can be suppressed, and disconnection of the output-side terminal wiring lines 18*tc*, the output-side terminal wiring lines 18*td*, and the input-side terminal wiring lines 18*te* provided on the second interlayer insulating film 17 can be suppressed.

Also, according to the organic EL display device 70*b* of the present embodiment, the height of the chip support body Sb is increased by an amount corresponding to the thickness of the first output terminal 20*f*, the second output terminal 20*g*, and the input terminal 20*h*. Thus, deflection of the organic EL display panel 50*b* at or near the bumps 61 of the integrated circuit chip 60 in the mounting step can be further suppressed. In this manner, cracking in the base coat film 11, the gate insulating film 13, the first interlayer insulating film 15, and the second interlayer insulating film 17 of the organic EL display panel 50*b* can be further suppressed, and disconnection of the output-side terminal wiring lines 18*tc*, the output-side terminal wiring lines 18*td*, and the input-side terminal wiring lines 18*te* provided on the second interlayer insulating film 17 can be further suppressed.

THIRD EMBODIMENT

Figure 12:
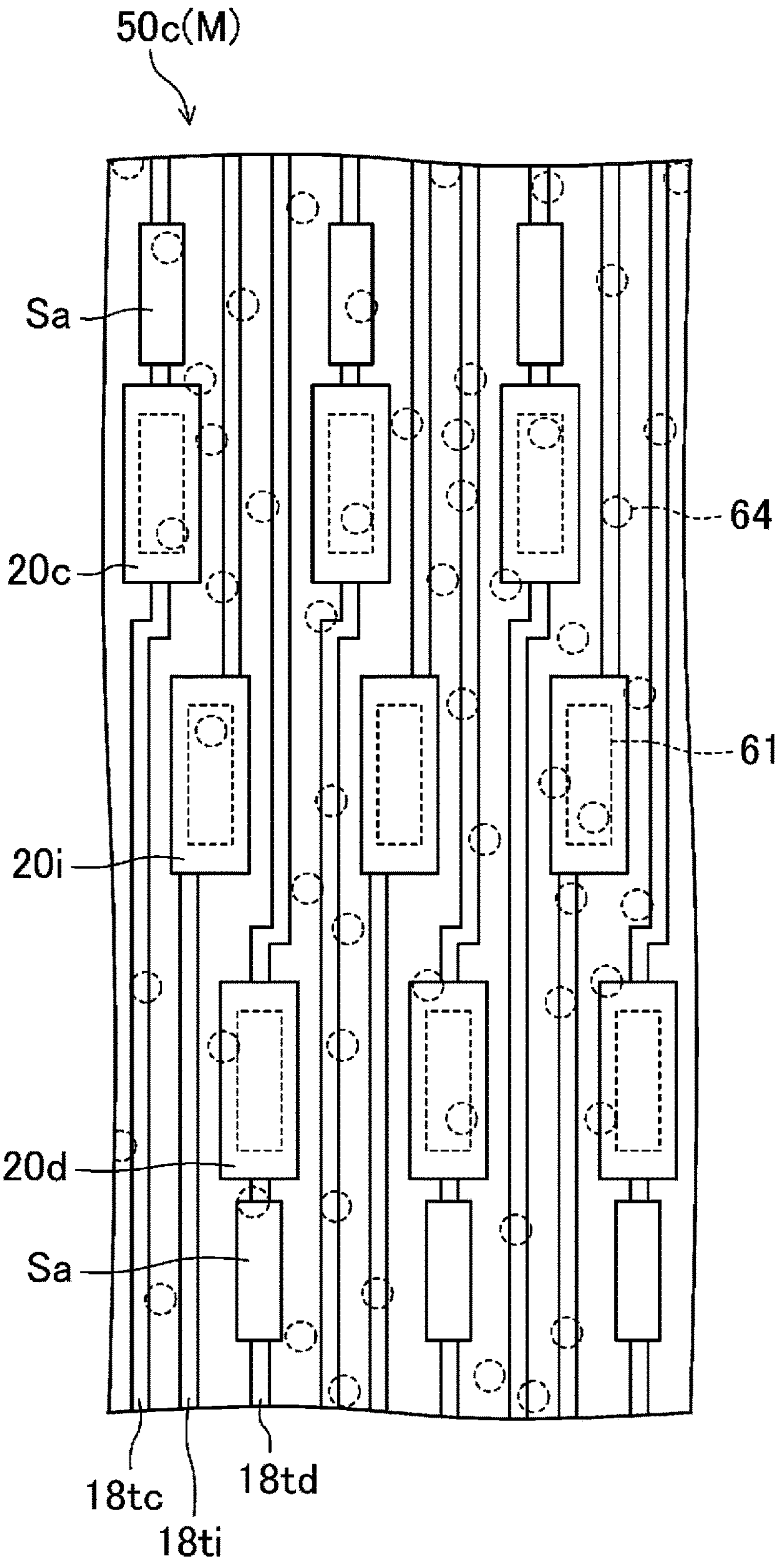
FIG. 12 corresponds to FIG. 7 and is an enlarged plan view of the chip mounting portion of the frame region of an organic EL display panel constituting an organic EL display device according to a third embodiment of the disclosure.
Figure 13:
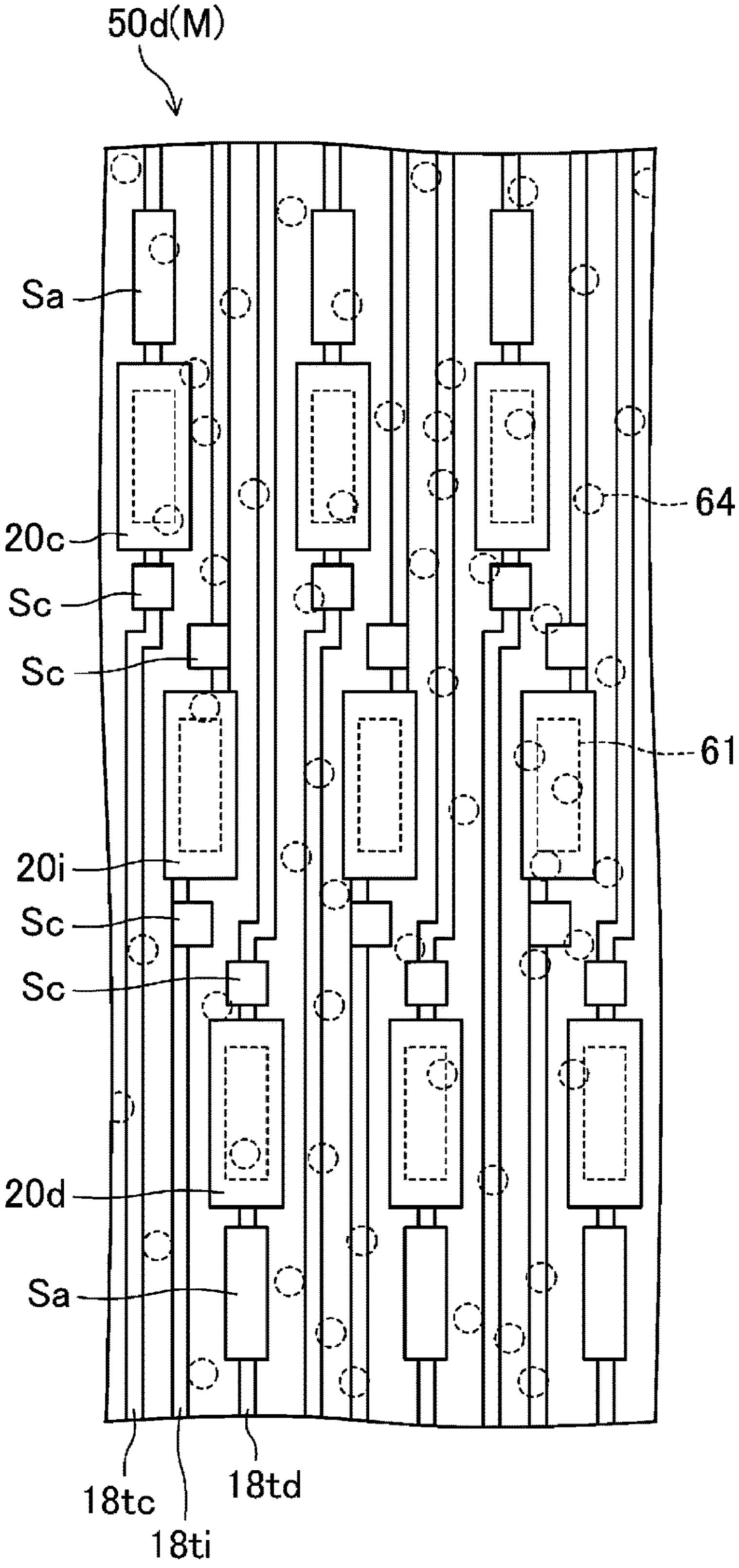
FIG. 13 corresponds to FIG. 12 and is a plan view of a modified example of the organic EL display panel constituting the organic EL display device according to the third embodiment of the disclosure.

FIG. 12 and FIG. 13 illustrate a third embodiment of a display device according to the disclosure. Also, FIG. 12 corresponds to FIG. 7 and is an enlarged plan view of the chip mounting portion M of the frame region F of an organic EL display panel 50*c* constituting the organic EL display device according to the present embodiment. FIG. 13 corresponds to FIG. 12 and is a plan view of an organic EL display panel 50*d*, which is a modified example of the organic EL display panel 50*c*.

In the first embodiment described above, the organic EL display device 70*a* includes the organic EL display panel 50*a* with a double layer structure in a plan view including the first output terminals 20*c* and the second output terminals 20*d*. However, in the present embodiment described below, the organic EL display device includes the organic EL display panel 50*c* with a triple layer structure in a plan view including the first output terminals 20*c*, the second output terminals 20*d*, and third output terminals 20*i*. In the present embodiment described below, an organic EL display device includes the organic EL display panel 50*c* with a triple layer structure in a plan view including the first output terminals 20*c*, the second output terminals 20*d*, and the third output terminals 20*i*. However, the organic EL display device may include an organic EL display panel with a quadruple or more layer structure in a plan view including output terminals.

As with the organic EL display device 70*a* of the first embodiment, the organic EL display device of the present embodiment includes the organic EL display panel 50*c*, the integrated circuit chip 60 mounted on the chip mounting portion M of the organic EL display panel 50*c*, and the flexible printed circuit 55 mounted on the terminal portion T of the organic EL display panel 50*c*.

As with the organic EL display panel 50*a* of the first embodiment described above, the organic EL display panel 50*c* includes the display region D provided in a rectangular shape in which an image is displayed and the frame region F provided in a frame-like shape in a periphery of the display region D.

As with the organic EL display panel 50*a* of the first embodiment described above, the organic EL display panel 50*c* includes the flexible substrate layer 10, the TFT layer 30 provided on the flexible substrate layer 10, the organic EL element layer 40 provided on the TFT layer 30, and the sealing film 45 provided covering the organic EL element layer 40.

The organic EL display panel 50*c* includes, in the chip mounting portion M of the frame region F, the under-chip circuit portion C, the plurality of output-side terminal wiring lines 18*tc*, the plurality of output-side terminal wiring lines 18*td*, and the plurality of output-side terminal wiring lines 18*ti* provided extending parallel to one another on the display region D side of the under-chip circuit portion C (see FIG. 12), and the plurality of input-side terminal wiring lines 18*te* provided extending parallel to one another on the terminal portion T side of the under-chip circuit portion C (see FIG. 6). As illustrated in FIG. 12, each output-side terminal wiring line 18*ti* is provided adjacent to one of the output-side terminal wiring lines 18*tc* and one of the output-side terminal wiring lines 18*td*. Note that as with the output-side terminal wiring lines 18*tc*, the output-side terminal wiring lines 18*td*, and the like, the output-side terminal wiring lines 18*ti* are provided as the third wiring line layer.

The organic EL display panel 50*c* includes, in the chip mounting portion M of the frame region F, the plurality of first output terminals 20*c* provided on the display region D side arranged in a row along the long side on the display region D side of the under-chip circuit portion C as chip terminals on the display region D side of the under-chip circuit portion C, the plurality of second output terminals 20*d* provided on the terminal portion T side arranged in a row along the long side on the display region D side of the under-chip circuit portion C as chip terminals on the display region D side of the under-chip circuit portion C, the plurality of third output terminals 20*i* (see FIG. 12) provided between the plurality of first output terminals 20*c* and the plurality of second output terminals 20*d* and arranged in a row along the long side on the display region D side of the under-chip circuit portion C as chip terminals on the display region D side of the under-chip circuit portion C, and the plurality of input terminals 20*e* provided arranged in a row along the long side on the terminal portion T side of the under-chip circuit portion C as chip terminals on the terminal portion T side of the under-chip circuit portion C. As illustrated in FIG. 12, the plurality of first output terminals 20*c*, the plurality of third output terminals 20*i*, and the plurality of second output terminals 20*d* are repeatedly arranged in the order of first output terminal 20*c*, third output terminal 20*i*, and second output terminal 20*d*. As with the first output terminals 20*c*, the second output terminals 20*d*, and the like, the third output terminals 20*i* is provided as the fourth wiring line layer. Also, the plurality of third output terminals 20*i* are layered on the plurality of output-side terminal wiring lines 18*ti* and are electrically connected to the plurality of output-side terminal wiring lines 18*ti*. Further, as with the plurality of first output terminals 20*c* and the plurality of second output terminals 20*d*, the plurality of third output terminals 20*i* are provided so as to correspond to the plurality of bumps 61 on the back surface of the integrated circuit chip 60 and is electrically connected to the plurality of bumps 61 via the anisotropic conductive film 65.

As illustrated in FIG. 12, the organic EL display panel 50*c* includes, in the chip mounting portion M of the frame region F, for each chip terminal including the plurality of first output terminals 20*c*, the plurality of second output terminals 20*d*, and the plurality of input terminals 20*e*, a chip support body Sa is provided in an island shape at each terminal wiring line overlapping the output-side terminal wiring line 18*tc*, the output-side terminal wiring line 18*td*, and the input-side terminal wiring line 18*te* corresponding to the chip terminal or an extension line E of the terminal wiring line. As illustrated in FIG. 12, the chip support body Sa may be provided for each chip terminal of the plurality of third output terminals 20*i*. As illustrated in FIG. 12, for each first output terminal 20*c*, the chip support body Sa is provided on the display region D side (upper side in the diagram) of the first output terminal 20*c*, and for each second output terminal 20*d*, the chip support body Sa is provided on the terminal portion T side (lower side in the diagram) of the second output terminal 20*d*. Also, a pair of the chip support bodies Sa are provided for each input terminal 20*e* with the pair of chip support bodies Sa sandwiching the input terminal 20*e* (see FIG. 6).

Note that in the present embodiment described above in which the gap between the third output terminals 20*i* and the first output terminals 20*c* and the second output terminals 20*d* is relatively narrow, the organic EL display panel 50*c* does not include a chip support body for the plurality of third output terminals 20*i*. However, the organic EL display panel 50*d* illustrated in FIG. 13 may be used. Specifically, as illustrated in FIG. 13, in the organic EL display panel 50*d*, the gap between the third output terminals 20*i* and the first output terminals 20*c* and the second output terminals 20*d* is designed to be relatively wide (for example, approximately 45 μm), and a plurality of chip support bodies Sc are provided as island shapes between the third output terminals 20*i* and the first output terminals 20*c* and the second output terminals 20*d*. As illustrated in FIG. 13, the chip support bodies Sc arranged on the upper side and the lower side in the diagram of the third output terminals 20*i* are provided for the third output terminals 20*i* and are provided on each terminal wiring line overlapping the output-side terminal wiring lines 18*ti* corresponding to the third output terminals 20*i*. As illustrated in FIG. 13, the chip support bodies Sc arranged on the lower side in the diagram of the first output terminals 20*c* are provided for the first output terminals 20*c* and are provided on each terminal wiring line overlapping the output-side terminal wiring lines 18*tc* corresponding to the first output terminals 20*c*. As illustrated in FIG. 13, the chip support bodies Sc arranged on the upper side in the diagram of the second output terminals 20*d* are provided for the second output terminals 20*d* and are provided on each terminal wiring line overlapping the output-side terminal wiring lines 18*td* corresponding to the second output terminals 20*d*.

As with the chip support body Sa in the first embodiment, the chip support body Sc includes the lower resin layer 19*b* formed of the same material as the first flattening film 19*a* in the same layer and the upper resin layer 21*b* provided on the lower resin layer 19*b* and formed of the same material as the second flattening film 21*a* in the same layer.

As with the organic EL display device 70*a* of the first embodiment, the organic EL display device according to the present embodiment including the organic EL display panel 50*c* described above has flexibility and is configured to display an image by causing the light-emitting layer 3 of the organic EL layer 33 to emit light as appropriate via the first TFT 9*a*, the second TFT 9*b*, and the third TFT 9*c* in each of the subpixels P.

As with the first embodiment, in the present embodiment described above, the organic EL display panel 50*c* includes the chip support bodies Sa separated from the first output terminals 20*c*, the second output terminals 20*d*, and the input terminals 20*e*. However, as with the second embodiment, the chip support bodies Sa (Sb) may be integrally formed with the first output terminals 20*c* (20*f*), the second output terminals 20*d* (20*g*), and the input terminals 20*e* (20*h*).

The organic EL display device including the organic EL display panel 50*c* of the present embodiment can be manufactured by changing the pattern shape of second wiring line layer, the fourth wiring line layer, the lower resin layer 19*b*, and the upper resin layer 21*b* in the manufacturing method for the organic EL display device 70*a* of the first embodiment.

As described above, according to an organic EL display device including the organic EL display panel 50*c* of the present embodiment, in the chip mounting portion M of the frame region F, for each chip terminal including the plurality of first output terminals 20*c*, the plurality of second output terminals 20*d*, and the plurality of input terminals 20*e*, the chip support body Sa is provided in an island shape at each terminal wiring line overlapping the output-side terminal wiring line 18*tc*, the output-side terminal wiring line 18*td*, and the input-side terminal wiring line 18*te* corresponding to the chip terminal or the extension line E of the terminal wiring line. This makes it difficult for the conductive particles 64 to clump together between chip support bodies Sa and the adjacently-disposed bumps 61. Thus, short-circuiting between the adjacent terminals due to the conductive particles 64 forming a connection can be suppressed, and short-circuiting between the terminals in the chip mounting portion M can be suppressed.

Also, according to the organic EL display device including the organic EL display panel 50*c* of the present embodiment, in the chip mounting portion M of the frame region F, the chip support bodies Sa are provided at or near the chip terminals including the plurality of first output terminals 20*c*, the plurality of second output terminals 20*d*, and the plurality of input terminals 20*e*. Thus, deflection of the organic EL display panel 50*c* at or near the bumps 61 of the integrated circuit chip 60 in the mounting step can be suppressed. In this manner, cracking in the base coat film 11, the gate insulating film 13, the first interlayer insulating film 15, and the second interlayer insulating film 17 of the organic EL display panel 50*c* can be suppressed, and disconnection of the output-side terminal wiring lines 18*tc*, the output-side terminal wiring lines 18*td*, the output-side terminal wiring lines 18*ti*, and the input-side terminal wiring lines 18*te* provided on the second interlayer insulating film 17 can be suppressed.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In each of the embodiments described above, the organic EL display device is exemplified as a display device. The disclosure can also be applied to a display device including a plurality of light-emitting elements driven by a current, for example, to a display device including quantum dot light-emitting diodes (QLEDs), which are a light-emitting element using a quantum dot-containing layer.

INDUSTRIAL APPLICABILITY

As described above, the disclosure is useful for a flexible display device.

The invention claimed is:

1. A display device comprising:

a flexible substrate layer;

a thin film transistor layer provided on the flexible substrate layer, the thin film transistor layer comprising a first flattening film, a wiring line layer, and a second flattening film layered, in this stated order, on the flexible substrate layer; and a light-emitting element layer provided on the thin film transistor layer, and comprising a plurality of light-emitting elements, the plurality of light-emitting elements arrayed such that each of the plurality of light-emitting elements corresponds to one of a plurality of subpixels that forms a display region;

a frame region provided around the display region;

a terminal portion extending in one direction and provided at an end portion of the frame region;

a chip mounting portion provided between the display region and the terminal portion;

a plurality of chip terminals arranged in a row in the chip mounting portion; and a plurality of terminal wiring lines corresponding to the plurality of chip terminals, the plurality of terminal wiring lines extending parallel to one another and being electrically connected to the plurality of chip terminals, respectively, wherein in the chip mounting portion, for at least one chip terminal of the plurality of chip terminals, a chip support body is provided, the chip support body overlapping one of a terminal wiring line that corresponds to the at least one chip terminal or an extension line of the terminal wiring line corresponding to the at least one chip terminal, the chip support body comprising:

a lower resin layer made of the same material as that of the first flattening film, and formed in the same layer as that of the first flattening film, and an upper resin layer provided on the lower resin layer, made of the same material as that of the second flattening film, and formed in the same layer as that of the second flattening film.

2. The display device according to claim 1, wherein the chip support body further comprises a metal layer provided between the lower resin layer and the upper resin layer, the metal layer being made of the same material as that of the wiring line layer, and formed in the same layer as that of the wiring line layer.

3. The display device according to claim 2, wherein the metal layer is formed as an extension of the at least one chip terminal.

4. A display device comprising:
a flexible substrate layer;
a thin film transistor layer provided on the flexible substrate layer;
a light-emitting element layer provided on the thin film transistor layer, and comprising a plurality of light-emitting elements, the plurality of light-emitting elements arrayed such that each of the plurality of light-emitting element corresponds to one of a plurality of subpixels that forms a display region;
a frame region provided around the display region;
a terminal portion extending in one direction and provided at an end portion of the frame region;
a chip mounting portion provided between the display region and the terminal portion;
a plurality of chip terminals arranged in a row in the chip mounting portion; and
a plurality of terminal wiring lines corresponding to the plurality of chip terminals, the plurality of terminal wiring lines extending parallel to one another and being electrically connected to the plurality of chip terminals, respectively,
wherein:
in the chip mounting portion, for at least one chip terminal of the plurality of chip terminals, a chip support body is provided, the chip support body overlapping one of a terminal wiring line corresponding to the at least one chip terminal or an extension line of the terminal wiring line corresponding to the at least one chip terminal,
the chip mounting portion is provided in a rectangular shape in a plan view with long sides of the chip mounting portion extending in the one extending direction of the terminal portion,
the chip mounting portion is provided with; a first chip terminal comprising a plurality of output terminals on a side of the display region, and a second chip terminal comprising a plurality of input terminals on a side of the terminal portion, and
a pair of chip support bodies is provided for the second chip terminal, for at least one input terminal of the plurality of input terminals, with the pair of chip support bodies sandwiching the at least one input terminal.

5. The display device according to claim 4, wherein in the chip mounting portion, as the plurality of output terminals of the first chip terminal, a plurality of first output terminals on the side of the display region, and a plurality of second output terminals on the side of the terminal portion are alternately provided in a zigzag shape, and
the chip support body is further provided, for at least one first output terminal of the plurality of first output terminals, on a side of a display region of the at least one first output terminal, and is provided, for at least one second output terminal of the plurality of second output terminals, on a side of a terminal portion of the at least one second output terminal.

6. The display device according to claim 1, wherein the chip support body is further provided for each chip terminal of the plurality of chip terminals.

7. The display device according to claim 4, wherein the chip mounting portion is provided with, as the plurality of output terminals of the first chip terminal, a plurality of first output terminals arranged in a row on the side of the display region, a plurality of second output terminals arranged in a row on the side of the terminal portion, and a plurality of third output terminals arranged in a row between the plurality of first output terminals and the plurality of second output terminals, and
the plurality of first output terminals, the plurality of third output terminals, and the plurality of second output terminals are repeatedly arranged along long sides of the chip mounting portion in order of the first output terminal, the third output terminal, and the second output terminal.

8. The display device according to claim 7, wherein the chip support body is further provided, for at least one first output terminal of the plurality of first output terminals, on a display region side of the at least one first output terminal, and is further provided, for at least one second output terminal of the plurality of second output terminals, on a terminal portion side of the at least one second output terminal.

9. The display device according to claim 8, wherein the chip support body is further provided, for the at least one first output terminal of the plurality of first output terminals, on a terminal portion side of the at least one first output terminal, is further provided, for the at least one second output terminal of the plurality of second output terminals, on a display region side of the at least one second output terminal, and is further provided, for at least one third output terminal of the plurality of third output terminals, on a display region side of the at least one third output terminal and a terminal portion side of the at least one third output terminal.

10. The display device according to claim 1, wherein an integrated circuit chip is mounted in the chip mounting portion via an anisotropic conductive film.

11. The display device according to claim 10, wherein, on a back surface of the integrated circuit chip, a plurality of bumps is provided such that each of the plurality of bumps corresponds to one of the plurality of chip terminals,
the anisotropic conductive film comprises conductive particles, and
the plurality of bumps and the plurality of chip terminals are electrically connected via the conductive particles, respectively.

12. The display device according to claim 1, wherein a flexible printed circuit is mounted in the terminal portion.

13. The display device according to claim 1, further comprising:
a sealing film provided covering the light-emitting element layer, the sealing film comprising a first inorganic sealing film, an organic sealing film, and a second inorganic sealing film, layered in this stated order.

14. The display device according to claim 1, wherein the plurality of light-emitting elements comprises organic electroluminescence elements.

15. The display device according to claim 4, wherein the chip support body further comprises a metal layer provided between the lower resin layer and the upper resin layer, the metal layer being made of the same material as that of the wiring line layer, and formed in the same layer as that of the wiring line layer.

16. The display device according to claim 15, wherein the metal layer is formed as an extension of the at least one chip terminal.

17. The display device according to claim 4, wherein a respective chip support body is further provided for each chip terminal of the plurality of chip terminals.

18. The display device according to claim 4, wherein an integrated circuit chip is mounted in the chip mounting portion via an anisotropic conductive film.

19. The display device according to claim 18, wherein, on a back surface of the integrated circuit chip, a plurality of bumps is provided such that each of the plurality of bumps corresponds to one of the plurality of chip terminals, the anisotropic conductive film comprises conductive particles, and the plurality of bumps and the plurality of chip terminals are electrically connected via the conductive particles, respectively.

20. The display device according to claim 4, wherein a flexible printed circuit is mounted in the terminal portion.

* * * * *